(12) United States Patent
Afzalian

(10) Patent No.: US 10,475,908 B2
(45) Date of Patent: Nov. 12, 2019

(54) SEMICONDUCTOR DEVICE AND METHOD OF FABRICATING THE SAME

(71) Applicant: TAIWAN SEMICONDUCTOR MANUFACTURING CO., LTD., Hsinchu (TW)

(72) Inventor: Aryan Afzalian, Chastre (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/659,699

(22) Filed: Jul. 26, 2017

(65) Prior Publication Data

US 2018/0308960 A1 Oct. 25, 2018

Related U.S. Application Data

(60) Provisional application No. 62/490,018, filed on Apr. 25, 2017.

(51) Int. Cl.
| | |
|---|---|
| *H01L 29/66* | (2006.01) |
| *H01L 29/06* | (2006.01) |
| *H01L 29/08* | (2006.01) |
| *H01L 29/78* | (2006.01) |
| *H01L 29/423* | (2006.01) |
| *H01L 29/739* | (2006.01) |

(52) U.S. Cl.
CPC .... *H01L 29/66977* (2013.01); *H01L 29/0653* (2013.01); *H01L 29/0676* (2013.01); *H01L 29/0847* (2013.01); *H01L 29/4238* (2013.01); *H01L 29/66522* (2013.01); *H01L 29/66666* (2013.01); *H01L 29/66795* (2013.01); *H01L 29/7391* (2013.01); *H01L 29/7827* (2013.01); *H01L 29/7853* (2013.01)

(58) Field of Classification Search
CPC ........... H01L 29/66977; H01L 29/0653; H01L 29/0847; H01L 29/4238; H01L 29/66522; H01L 29/66666; H01L 29/66795; H01L 29/7827; H01L 29/7853
USPC ........................................................ 257/329
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,209,247 B2 | 12/2015 | Colinge et al. |
| 9,236,267 B2 | 1/2016 | De et al. |

(Continued)

*Primary Examiner* — Tong-Ho Kim
(74) *Attorney, Agent, or Firm* — McClure, Qualey & Rodack, LLP

(57) ABSTRACT

A semiconductor device includes a channel region, a source region having a first type semiconductor and a drain region having a second type semiconductor on opposing sides of the channel region. A gate stack is disposed over the channel region. A low-k spacer is disposed over the source region and abreast the gate stack. The source region includes a first type dopant, and the drain region includes a second type dopant. A pocket is disposed between the channel region and the source region. The pocket has the first type semiconductor and a higher first type dopant concentration than a first type dopant concentration of the source region.

20 Claims, 45 Drawing Sheets

(56) References Cited

U.S. PATENT DOCUMENTS

| | | | |
|---|---|---|---|
| 9,245,805 B2 | 1/2016 | Yeh et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2012/0298959 A1* | 11/2012 | Verhulst | B82Y 10/00 257/27 |
| 2014/0034908 A1* | 2/2014 | Bangsaruntip | H01L 29/775 257/27 |
| 2016/0071965 A1* | 3/2016 | Afzalian | H01L 29/165 257/12 |
| 2017/0365712 A1* | 12/2017 | Bu | H01L 29/7827 |

* cited by examiner

SEMICONDUCTOR DEVICE AND METHOD OF FABRICATING THE SAME

PRIORITY CLAIM AND CROSS-REFERENCE

This application claims priority to U.S. Provisional Application Ser. No. 62/490,018, filed Apr. 25, 2017, which is herein incorporated by reference.

BACKGROUND

Tunnel field-effect transistors (TFETs) are typically recognized as successors of metal-oxide semiconductor field-effect transistors (MOSFETs) because of their ability to achieve steep subthreshold slope (and of their resulting low off-currents. Due to their transport mechanism based on band-to-band tunnelling indeed, the TFET subthreshold swing can be less than 60 mV/dec (at room temperature), which is the physical limit of conventional MOSFETs, such that potentially lower supply voltages can be used. Different TFET integration approaches exist for both horizontal and vertical technologies.

However, due to the limitation of the tunnelling probability and the tunnelling area for the source junction, the TFET is faced with a problem of small on-state current, which is far less than that of the conventional MOSFET, and this greatly limits the application of the TFET. This is because TFET current is based on band-to-band tunnelling (BTBT) and not on thermionic current. The TFET current may even saturate or drop while increasing $V_G$, especially at low $V_D$. The TFET on-current saturation is related to source depletion. Source depletion may increase the tunneling distance and limit on-current and create a barrier between the ungated source and part of the core-channel (effectively the source) under the gate in a line tunneling TFET.

For example, in case of N-TFET, a more positively charged $V_G$ tends to deplete the p-type source. In case of P-TFET, a more negatively charged $V_G$ tends to deplete the n-type source when the device is switched on, such that the electric field at the tunnelling junction is not sufficiently large when the TFET turns on, causing the sub-threshold slope of the TFET to be degraded relative to the theoretical value. Therefore, it has become an important issue of the TFET that how to change the source junction configuration in order to supress source depletion.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
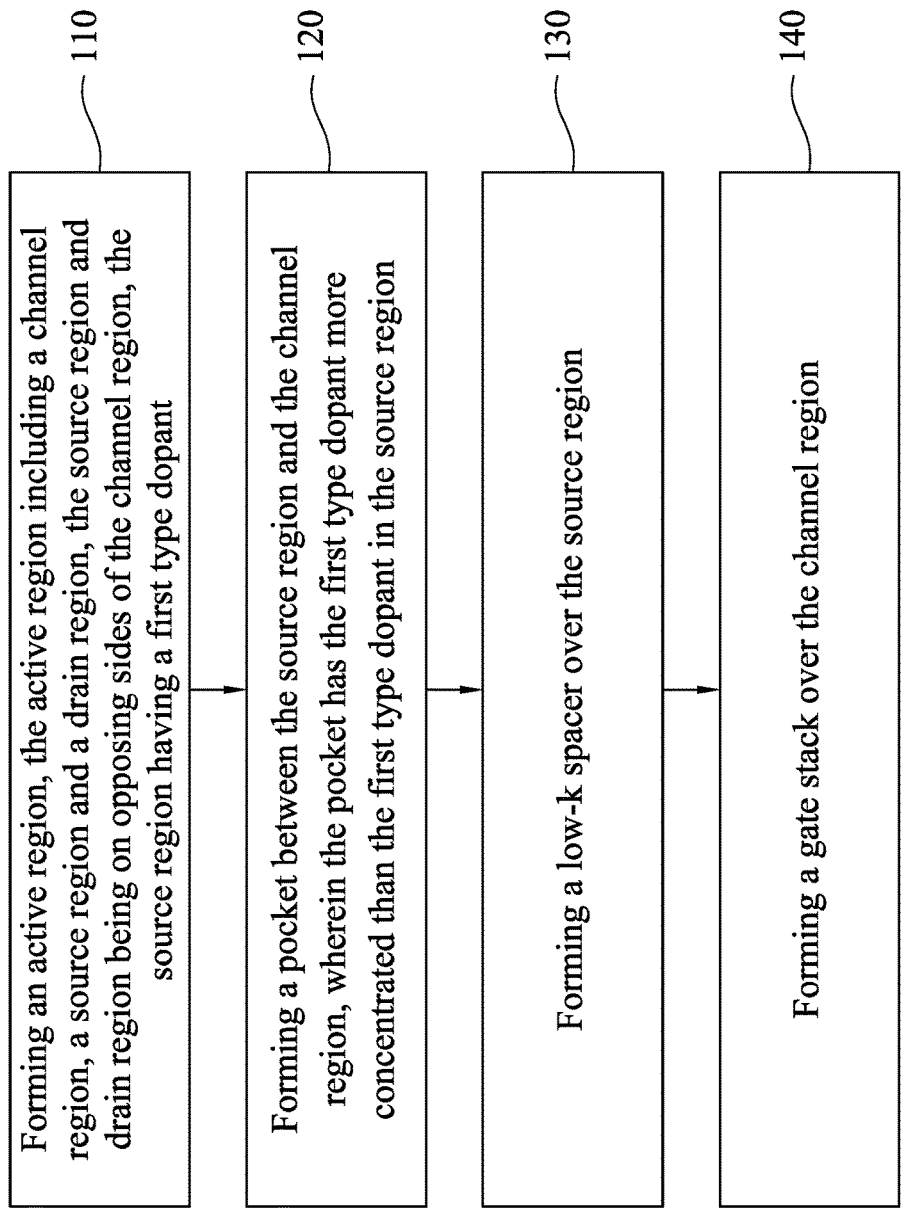
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Referring to FIG. 1, a flow chart of a method 100 of fabricating a semiconductor device in accordance with some embodiments of the instant disclosure. The method begins with operation 110 in which an active region is formed. The active region includes a channel region, a source region and a drain region. The source region and drain region are on opposing sides of the channel region. The source region has a first type dopant. The method continues with operation 120 in which a pocket is formed between the source region and the channel region by doping a portion of the source region closer to the channel region with the first type dopant more concentrated than the source region. Subsequently, operation 130 is performed. A low-k spacer is formed over the source region. The method continues with operation 140 in which a gate stack is formed over the channel region. The discussion that follows illustrates embodiments of semiconductor devices that can be fabricated according to the method 100 of FIG. 1.

Figure 2:
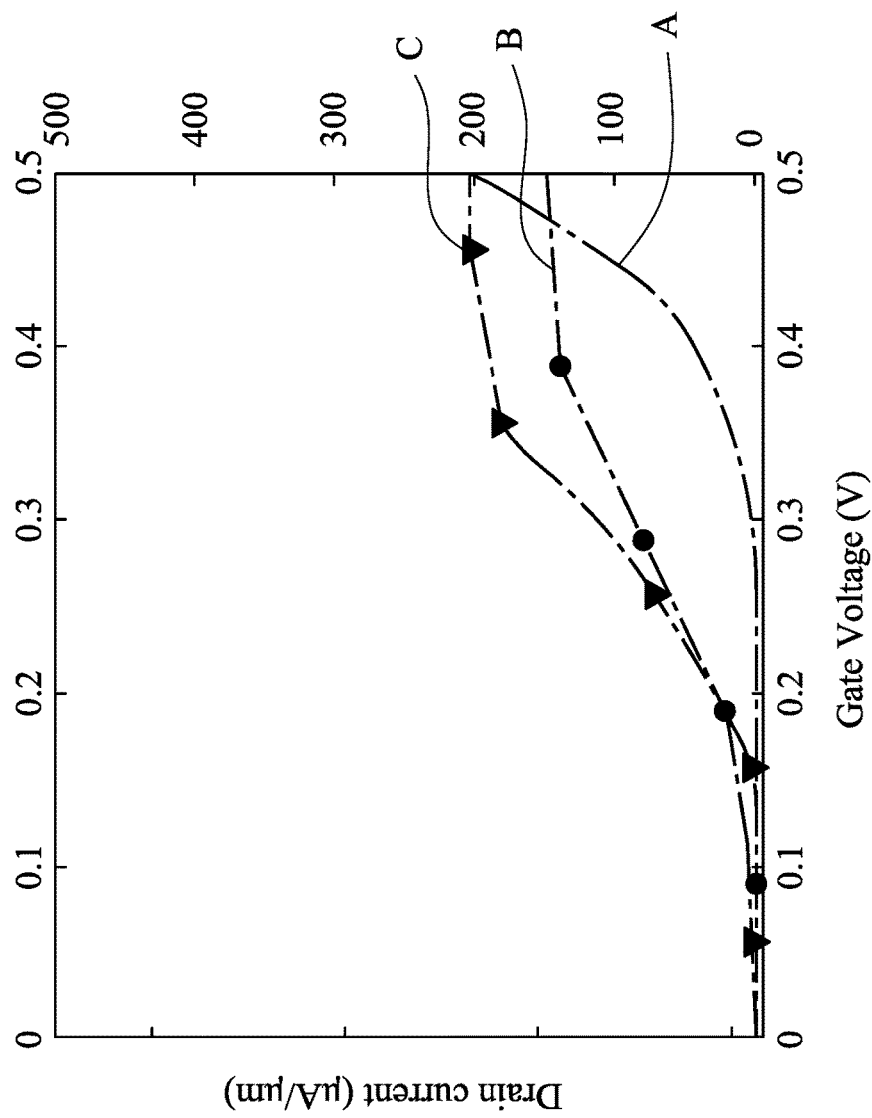
FIG. 2 is a graph showing the on-state drain current in different configurations.

As previously discussed, source depletion results in low on-state current ($I_{ON}$) in TFET devices. By introducing low-k spacer over the source region or source/channel junction or a heavily doped pocket region at the source/channel junction $I_{ON}$ is boosted because source depletion is minimized at the on-state. Reference is made to FIG. 2. The drain current in µA/µm is plotted against gate voltage (V). Curve A represents standard silicon NMOS on-state current. Curve B represents TFET that has a shell surrounding the channel region but not low-k spacer and not heavily doped pocket at the source/channel junction. Curve C represents TFET that has a shell surrounding the channel region and low-k spacer and heavily doped pocket at the source/channel junction. An increase of on-state current between curve B and curve C can be seen. Due to the employment of the low-k spacer and heavily doped pocket, source depletion is minimized and the on-current shows great improvement by at least 50 µA/µm. Methods of forming the TFET in accordance with some embodiments of the instant disclosure are elaborated hereinafter.

FIGS. 3-16 illustrate cross-sectional view of an exemplary vertical gate-all-around (VGAA) TFET 200 being either p-type VGAA TFET or n-type VGAA TFET in accordance with some embodiments. VGAA TFET 200 has a vertical channel region, and a gate dielectric layer and a gate electrode encircling the vertical channel region. In a VGAA TFET, one of the source/drain regions is over the channel region, and the other one of the source/drain regions is below the channel region. The source region has a heavily doped pocket at closer to the channel region. Furthermore, a semiconductor shell wraps around the channel region, interposed between the gate dielectric layer and the channel region, and a low-k spacer forms a ring over the source region.

Throughout the description degree of dopant concentration is described as intrinsic (for example, with dopant concentrations lower than about $1E17/cm^3$), moderately doped (for example, with dopant concentrations between about $1E17/cm^3$ and about $1E19/cm^3$), heavily doped (for example, with dopant concentrations between about $1E19/cm^3$ and about $1E21/cm^3$), or beyond dopant saturation (for example, with dopant concentrations higher than about $1E21/cm^3$).

Figure 3:
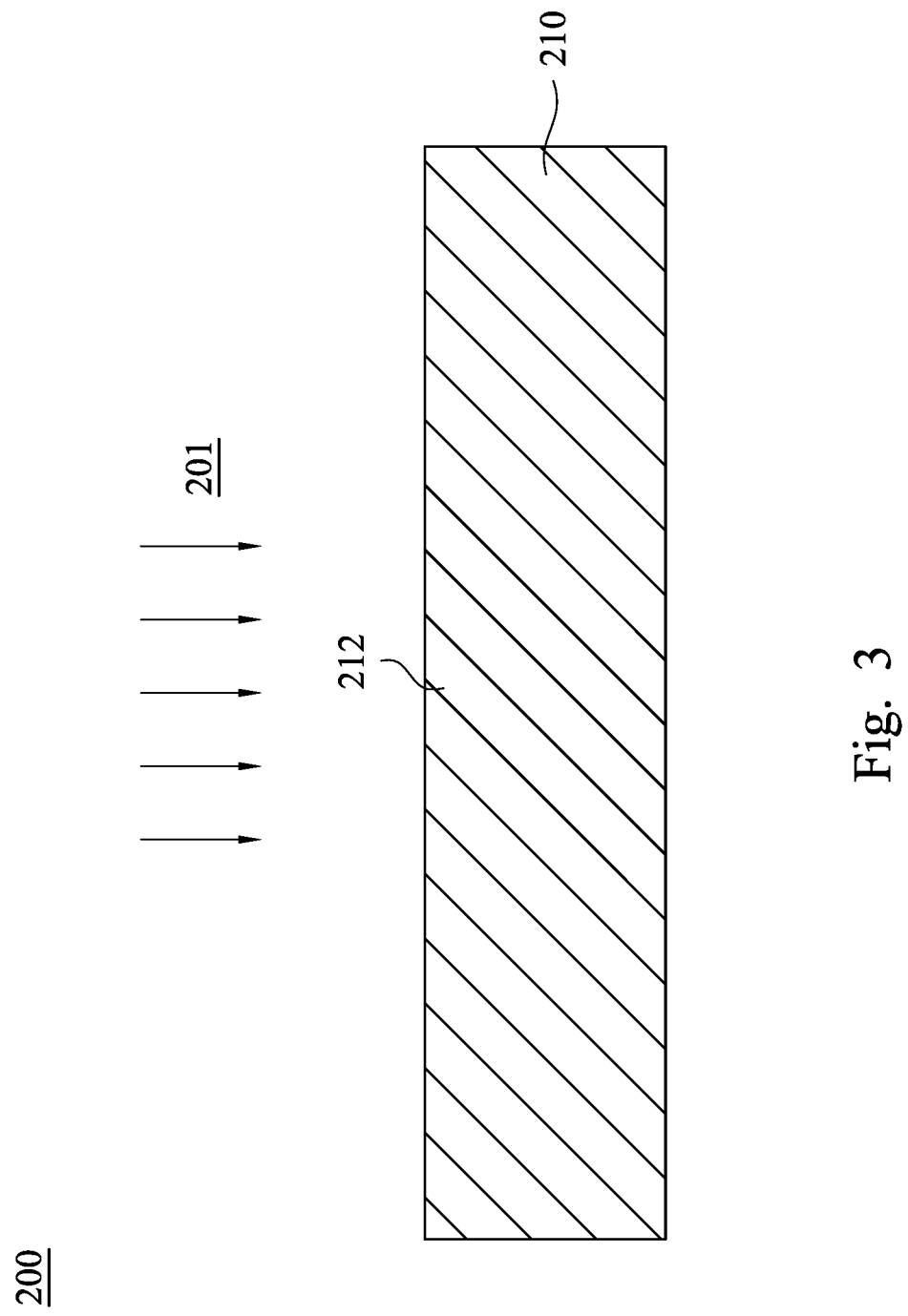
FIGS. 3-19 are cross-sectional views of a portion of a semiconductor device at various stages in a low-k spacer formation process in accordance with some embodiments of the instant disclosure.

Reference is made to FIG. 3 and operation 110 in FIG. 1. A lower semiconductor layer 210 is formed. The lower semiconductor layer 210 may be formed over a base semiconductor substrate (not shown) using an epitaxy process, such as metal-organic (MO) chemical vapor deposition (CVD), molecular beam epitaxy (MBE), liquid phase epitaxy (LPE), vapor phase epitaxy (VPE), selective epitaxial growth (SEG), combinations thereof, and the like. The lower semiconductor layer 210 includes a first type semiconductor. Examples of the first type semiconductor may include group IV materials such as Si, Ge, C and binary compounds thereof, or Group III-V materials such as In, Ga, As, Sb, Al, P, B, N and binary, tertiary and quaternary compounds. For example, the lower semiconductor layer 210 may include GaSb.

Reference is still made to FIG. 3. An epitaxial process 201 is performed to form the source region 212 with a first type dopant. In some embodiments, in which the VGAA TFET 200 is an n-type transistor, the first type dopant is a p-type dopant. In some embodiments, in which the VGAA TFET 200 is a p-type transistor, the first type dopant in the source region 212 is an n-type dopant. The source region 212 may be a moderately doped source region 212. The source region 212 may have a dopant concentration ranging between about a few $1E18/cm^3$ to a few $1E19/cm^3$. The first type dopant concentration in the source region 212 is lower than about $1E19/cm^3$.

Figure 4:
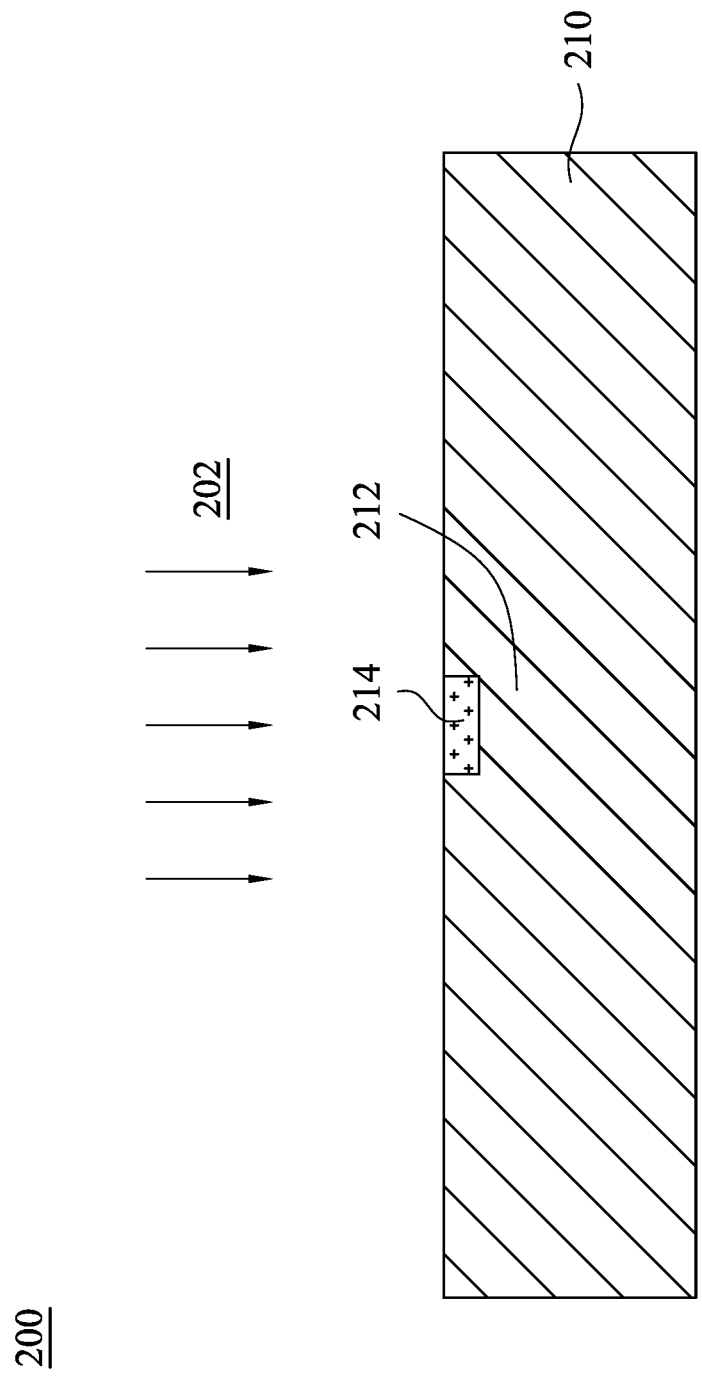

Reference is made to FIG. 4 and operation 130 in FIG. 1. An epitaxial process 202 is performed to form a pocket 214 in the source region 212. The source region 212 has the first type dopant, and the pocket 214 is more intensely doped with the first type dopant to a degree of heavily doped or beyond saturation. The pocket 214 occupies a portion of the existing source region 212 close to an interface where the nanowire layer will form. The epitaxial process 202 results in the pocket 214 being saturated with the first type dopant. The first type dopant concentration of the pocket 214 is higher than the dopant concentration in the source region 212 of about 2 to 50 factor. A leap in the dopant concentration is shown between the remaining source region 212 and the pocket 214. For example, in some embodiments, the source region 212 has a first type dopant concentration of about $1E19/cm^3$, and the pocket 214 has a first type dopant concentration of about $5E19/cm^3$. In some embodiments, the source region 212 has a first type dopant concentration of about $5E18/cm^3$, and the pocket 214 has a first type dopant concentration of about $1E20/cm^3$.

Figure 5:
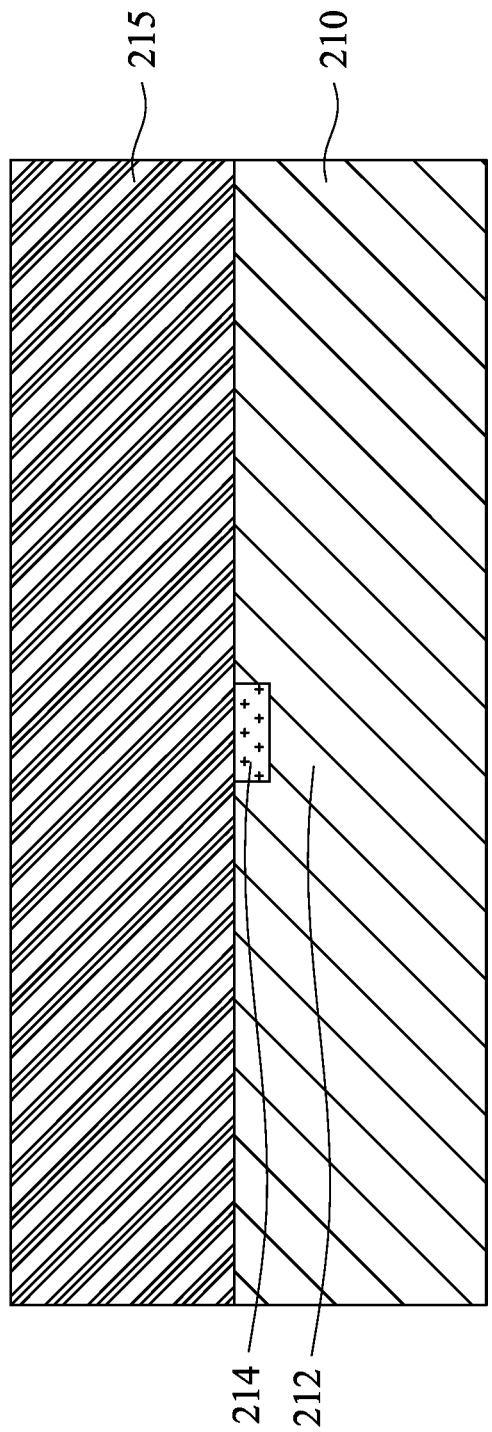

Reference is made to FIG. 5 and operation 110 in FIG. 1. A nanowire layer 215 is deposited on the lower semiconductor layer 210. The nanowire layer 215 is blanket deposited on a top surface of the lower semiconductor layer 210. In some embodiments, various epitaxies may be performed to form the nanowire layer 215. Any suitable epitaxy processes may be used, such as by MO CVD, MBE, LPE, VPE, SEG, combinations thereof, or the like. The nanowire layer 215 is a semiconductor layer and is patterned into the channel region in subsequent process. The nanowire layer 215 is an intrinsic semiconductor layer and is patterned into the channel region in subsequent process. The pocket 214 is interposed between the nanowire layer 215 and the source region 212. The pocket 214 is in direct contact with the nanowire layer 215. The nanowire layer 215 includes semiconductor materials. Examples of the semiconductor material may include group IV materials such as Si, Ge, C and binary compounds thereof, or Group III-V materials such as In, Ga, As, Sb, Al, P, B, N and binary, tertiary and quaternary compounds. For example, in some embodiments, the nanowire layer 215 includes InAs.

Figure 6:
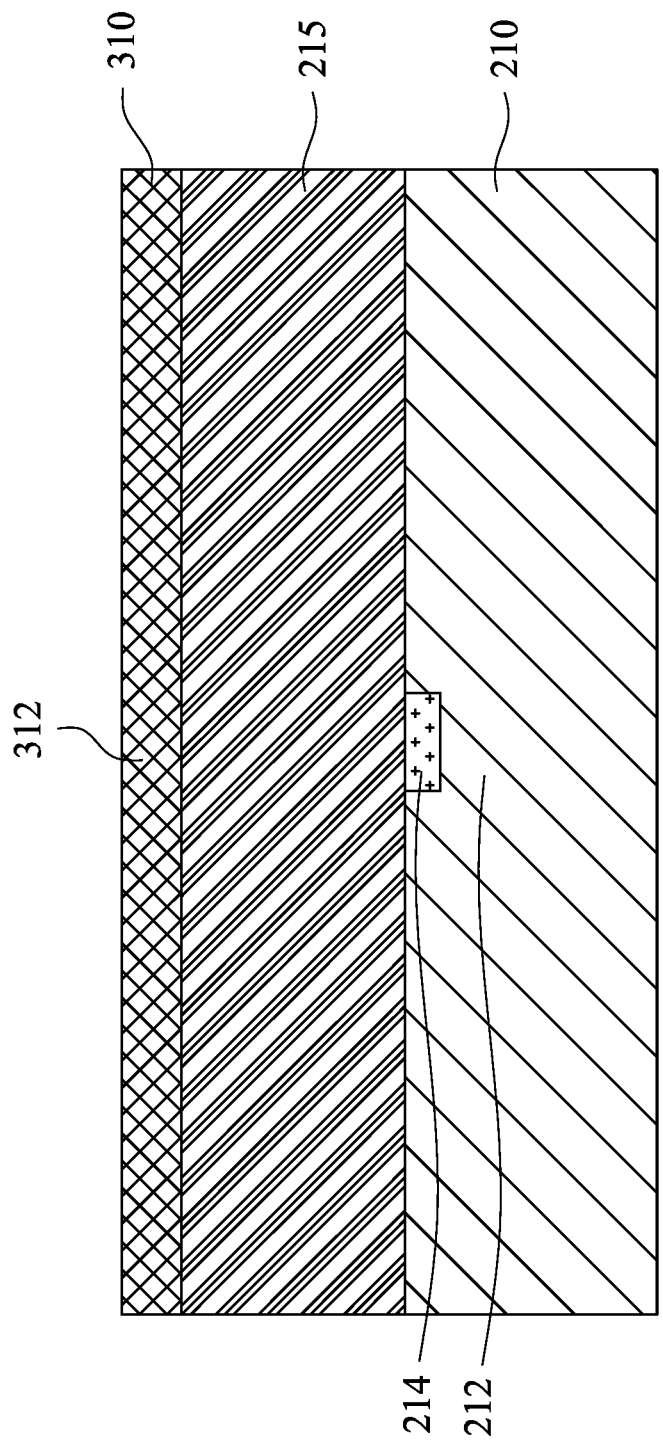

Reference is made to FIG. 6 and operation 110 of FIG. 1. An upper semiconductor layer 310 is deposited on the nanowire layer 215. The lower semiconductor layer 219 may be formed using similar deposition process as the lower semiconductor layer 210. The upper semiconductor layer 310 includes a second type semiconductor. Examples of the second type semiconductor may include group IV materials such as Si, Ge, C and binary compounds thereof, or Group III-V materials such as In, Ga, As, Sb, Al, P, B, N and binary, tertiary and quaternary compounds. The first type semiconductor (lower semiconductor layer 210) is different from the second type semiconductor (upper semiconductor layer 310). For example, the lower semiconductor layer 210 may include GaSb, and the upper semiconductor layer 310 may include InAs.

Reference is still made to FIG. 6. The drain region 312 and the source region 212 are on opposing sides of the nanowire layer 215. The drain region 312 has a second type dopant. In some embodiments, in which the VGAA TFET 200 is an n-type transistor, the second type dopant is an n-type dopant. In some embodiments, in which the VGAA TFET 200 is a p-type transistor, the second type dopant in the drain region 312 is a p-type dopant. The drain region 312 may be a moderately doped or a heavily doped drain region 312. The drain region 312 may have a dopant concentration ranging between about $1E17/cm^3$ and about $1E21/cm^3$.

Figure 7:
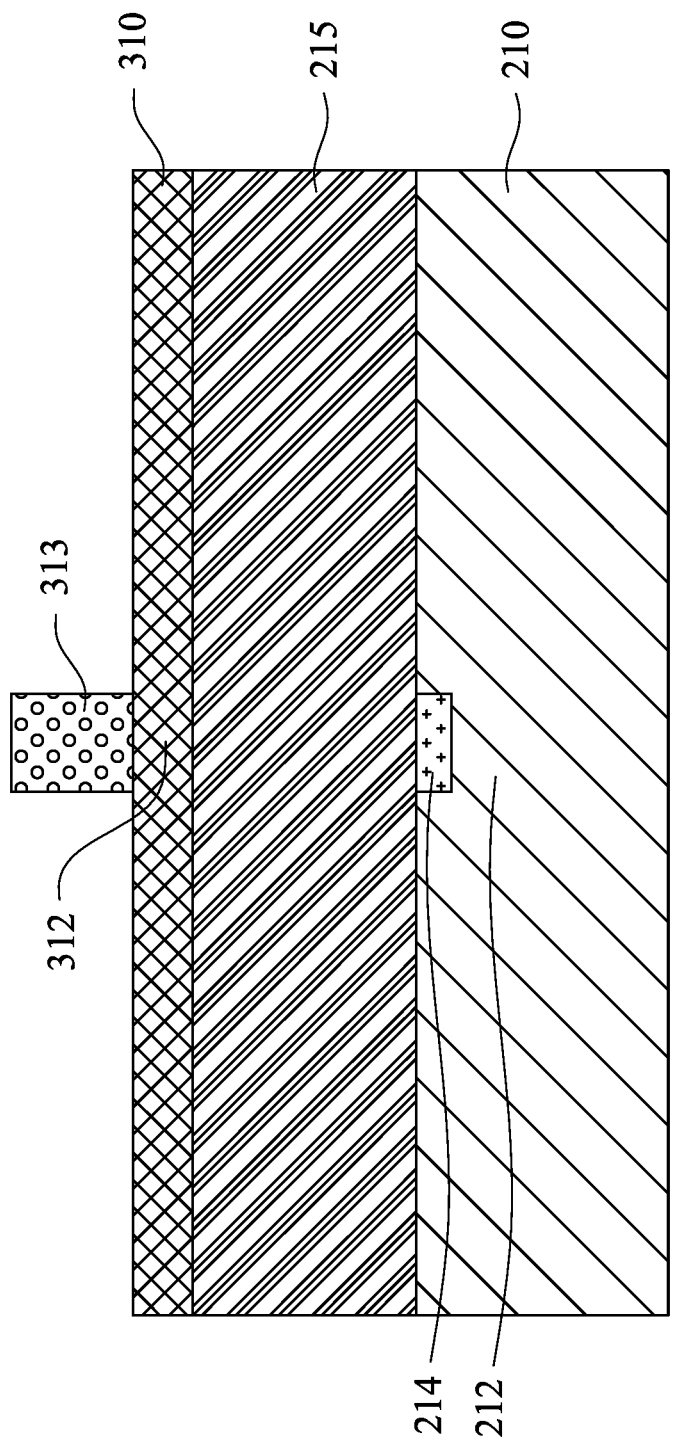

Reference is made to FIG. 7. A hard mask 313 is formed on the upper semiconductor layer 310. The hard mask 313 undergo lithography and etching process, and the coverage of the hard mask 313 overlaps the source region 212 in the lower semiconductor substrate 210 and the drain region 312 in the upper semiconductor substrate 310. The hard mask 313 may include one or more oxide (e.g., silicon oxide) and/or nitride (e.g., silicon nitride) layers to prevent damage to the underlying layers during patterning.

Figure 8:
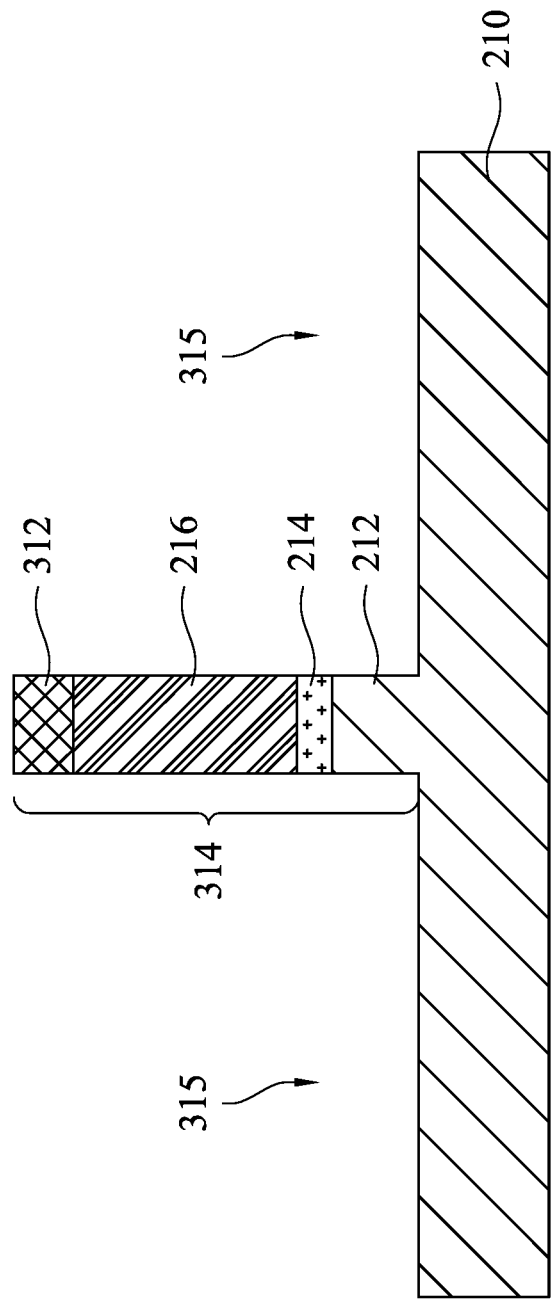

Reference is made to FIG. 8. The VGAA TFET 200 undergoes patterning process to form a semiconductor column 314. An etching process either wet etch or dry etch is performed to remove layers exposed from the hard mask 313. After patterning, the channel region 216 is standing on the source region 212, and the drain region 312 is on the other end of the channel region 216. The source region 212 and the drain region 312 are on opposing sides of the channel region 216 in the semiconductor column 314. The channel region 216 is sandwiched between the source region 212 and the drain region 312. The pocket 214 is at the junction where the source region 212 and the channel region 216 meet.

Reference is still made to FIG. 8. Portion of the lower semiconductor layer 210 is removed in the patterning process such that the source region 212 becomes a protruded portion on the lower semiconductor layer 210 as shown in FIG. 7. The patterning process results in a narrow semiconductor column extending upwardly from the source region 212. A recess 315 is formed on the lower semiconductor layer 210, and the recess 315 is where the spacer will be formed in subsequent process.

Figure 9:
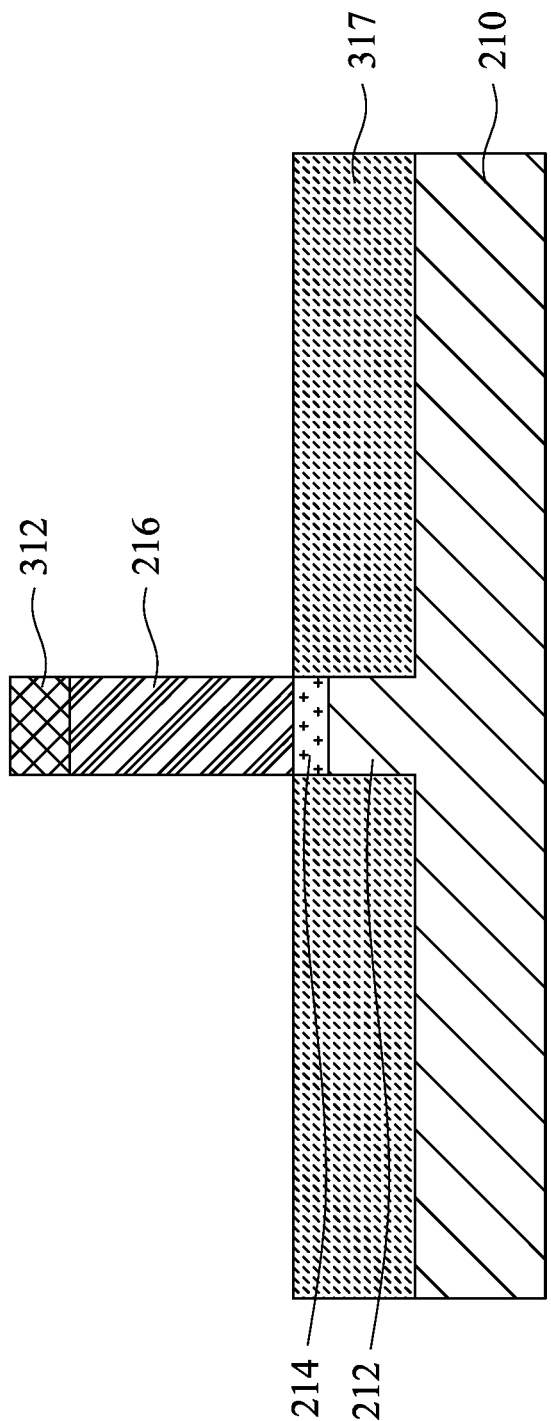

Reference is made to FIG. 9 and operation 140 in FIG. 1. A low-k spacer material 317 is deposited in the recess 315 on the lower semiconductor layer 210. The low-k spacer material may be deposited by using any suitable techniques including but not limited to, chemical vapor deposition and spin-on coating. The low-k spacer material 317 encircles the source region 212 and the pocket 214 and blankets the top surface of the lower semiconductor substrate 210. The recess 315 is filled in by the low-k spacer material 317. Examples of low-k (k smaller than 6) spacer materials include, but are not limited to, hydrogen silsesquioxane polymer (HSQ), methyl silsesquioxane polymer (MSQ), polyphenylene oligomer, methyl doped silica or SiOx(CH3)y or SiCxOyHz or SiOCH, organosilicate glass (SiCOH) and porous SiCOH, silicon oxide, boron nitride, silicon oxynitride and the like. In some embodiments, the low-k spacer material includes air gaps (not shown). The low-k spacer material 317 covers a portion of the semiconductor column 314 and does not cover the remaining portion of the semiconductor column 314 from the channel region 216 above.

Figure 10:
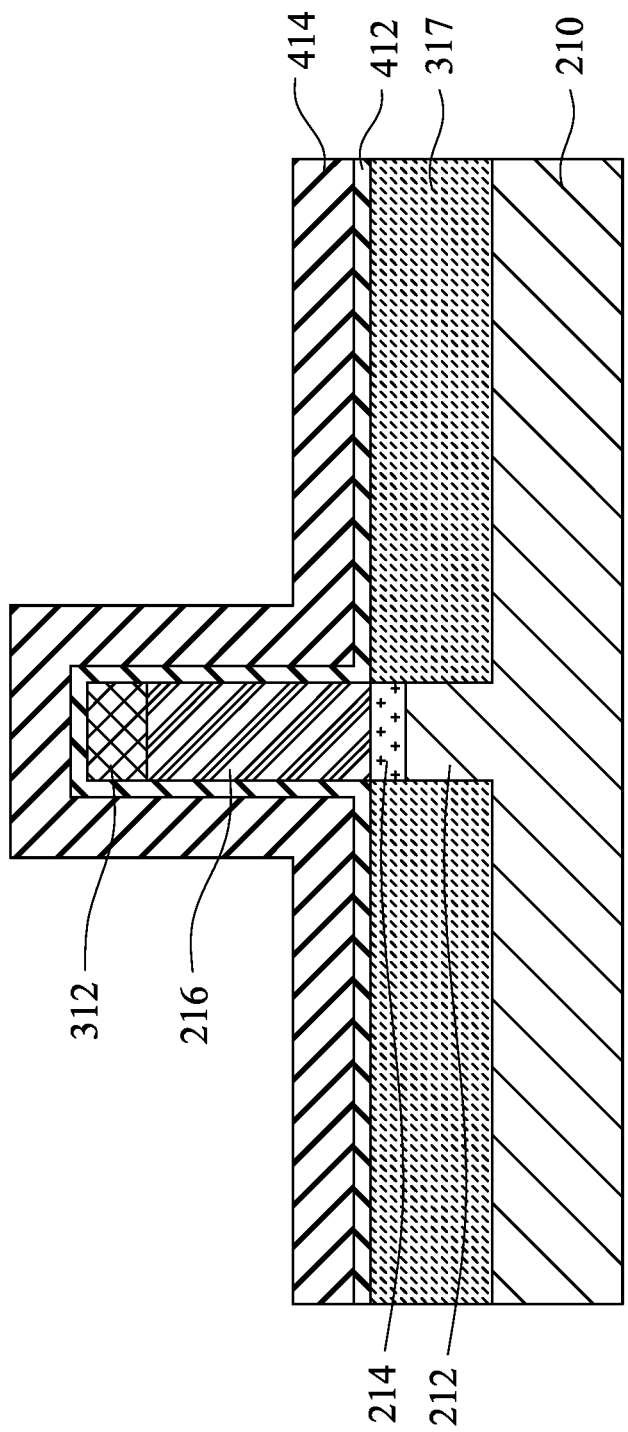

Reference is made to FIG. 10 and operation 150. A gate dielectric layer 412 and a gate electrode 414 are conformally formed on the semiconductor column 314. The gate dielectric layer 412 and the gate electrode 414 may be deposited by for example, CVD, PVD, ALD, spreading, spin coating, or the like. The gate dielectric layer 412 blankets the underlying low-k spacer material 317 and goes along the exposed surface of the channel region 216, and drain region 312. The protruded semiconductor column 314 is reproduced by the gate dielectric layer 412 and the gate electrode 414. In some embodiments, the gate dielectric layer 412 is high-k dielectric layer (k is larger than 6). Examples of the high-k gate dielectric materials include, but are not limited to, tantalum oxide, hafnium oxide, zirconium oxide, titanium oxide, aluminum oxide, hafnium silicates, hafnium dioxide-alumina alloy, or other suitable materials. Examples of the gate electrode materials include, but are not limited to, titanium, titanium nitride, titanium-aluminum, aluminum, aluminum nitride, tantalum, tantalum nitride, tantalum carbide, tantalum carbonitride, tantalum silicon nitride, tantalum silicide, or other suitable materials. The source region 212 and the pocket 214 are free of the gate dielectric layer 412 and the gate electrode 414 because the low-k spacer material 317 occupies the surrounding region of the source region 212 and the pocket 214.

Figure 11:
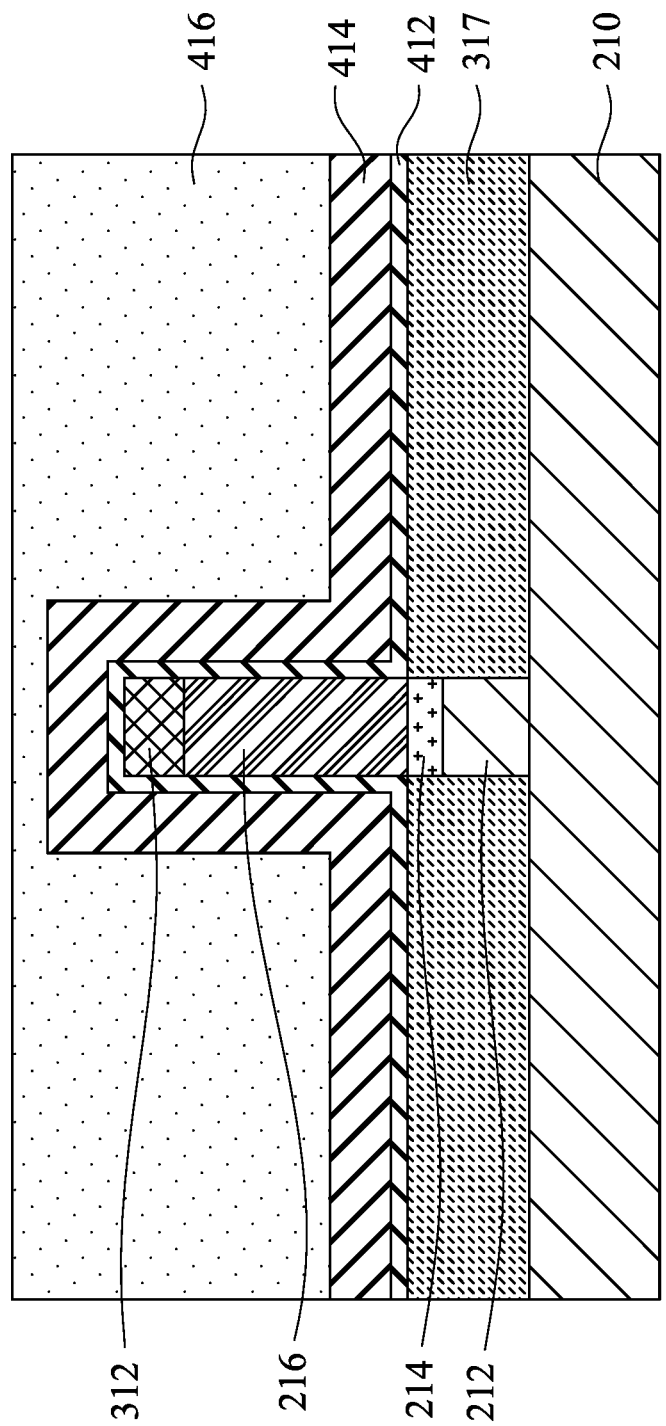

Reference is made to FIG. 11. After the deposition of the gate dielectric layer 412 and the gate electrode 414, an interlayer dielectric layer 416 is deposited. The interlayer dielectric layer 416 blankets the semiconductor column 314 and has a thickness that is sufficient to bury the entire semiconductor column 314 including the drain region 312.

Figure 12:
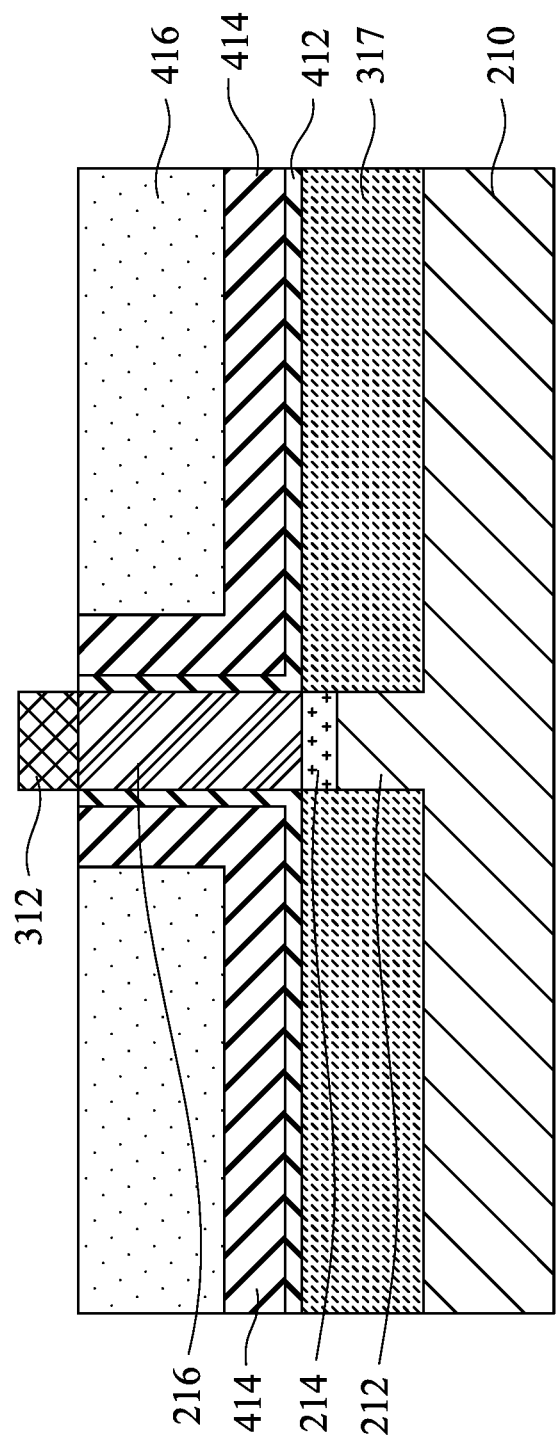

Reference is made to FIG. 12. An etching back is performed to remove a portion of the interlayer dielectric layer 416, gate dielectric layer 412, and gate electrode 414. As shown in FIG. 12, the drain region 312 is released from the coverage of the gate dielectric layer 412, gate electrode 414 and interlayer dielectric layer 416. The channel region 216 is wrapped around by the gate dielectric layer 412, gate electrode 414 and interlayer dielectric layer 416 in full concentric rings. The drain region 312 is a bump protruding from the top surface of the interlayer dielectric layer 416.

Figure 13:
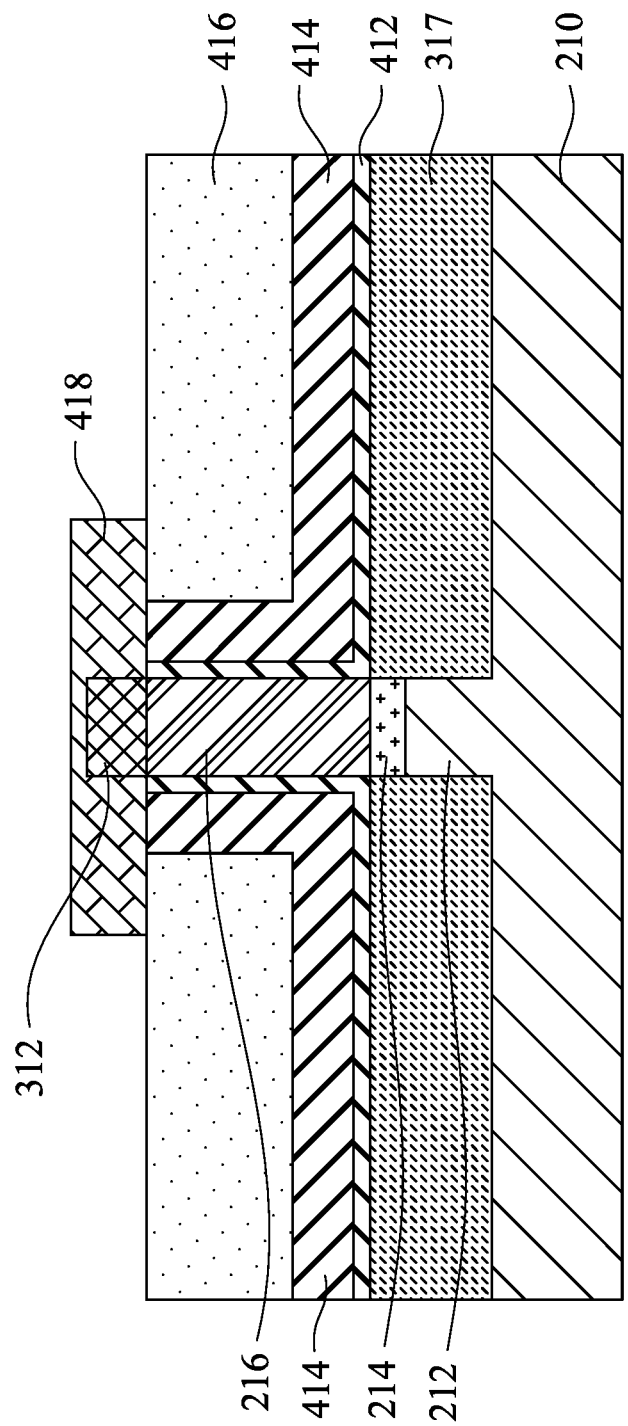

Reference is made to FIG. 13. A low-k spacer 418 is formed around the drain region 312. The low-k spacer 418 forms a full ring encircling the drain region 312. The low-k spacer 418 may be formed by depositing a low-k spacer material on the interlayer dielectric layer 416. Subsequently, a patterning process is performed to remove excess low-k spacer material, leaving the low-k spacer 418 shown in FIG. 13. The drain region 312, gate dielectric layer 412, gate electrode 414 and a portion of the interlayer dielectric layer 416 are under the coverage of the low-k spacer 418. The remaining portion of the interlayer dielectric layer 416 is exposed.

Figure 14:
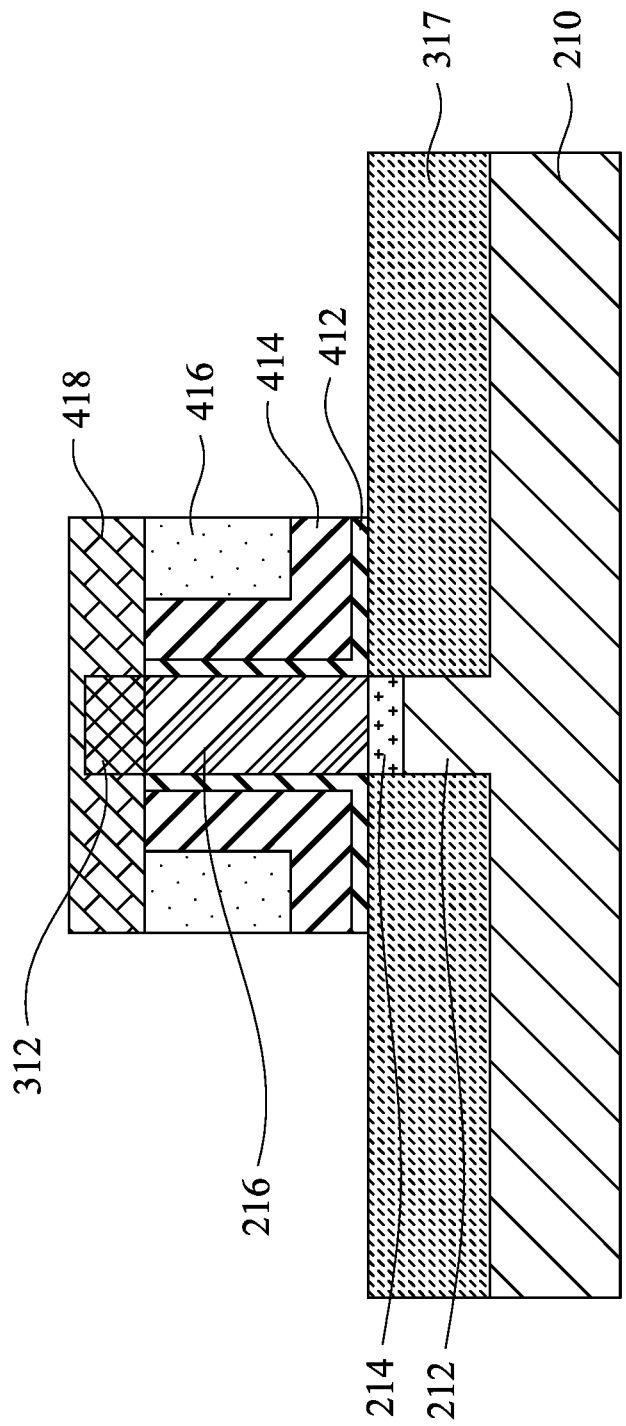

Reference is made to FIG. 14. The low-k spacer 418 is used as a mask layer in a subsequent patterning process to trim the materials exposed from its coverage. The portion of the interlayer dielectric layer 416 that is not covered by the low-k spacer 418 is removed during the patterning process. The gate dielectric layer 412 and gate electrode 414, which are underlying the exposed interlayer dielectric layer 416, are removed. After patterning, the gate dielectric layer 412 and the gate electrode 414 are in a shape of "L". One leg of the L rests parallel with the channel region 216, and the other leg rests on the low-k spacer material 317 on the lower semiconductor layer 210. The low-k spacer material 317 may serve as an etch stop layer in the patterning process, and the top surface of the low-k spacer material 317 is exposed. The drain region 312 is well protected by the low-k spacer 418 in the patterning process. The components underlying the low-k spacer 418 are retained after the patterning process.

Figure 15:
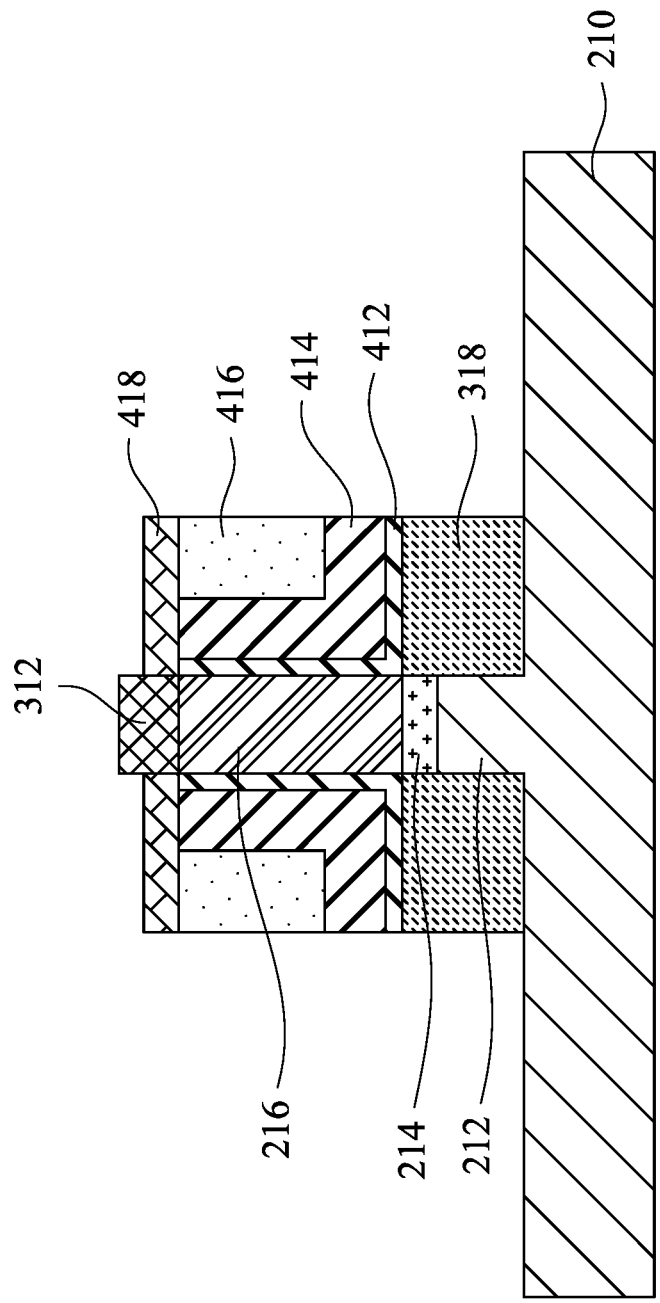

Reference is made to FIG. 15. Excess low-k spacer material 317 is then removed to form the low-k spacer 318, and a VGAA transistor is complete. The VGAA TFET 200 has the pocket 214 between the source region 212 and channel region 216. The pocket 214 is heavily doped with the same type of dopant as the source region 212. The insertion of the pocket 214 minimizes source depletion, and therefore an increase of on-current (Ion) level can be obtained. The improvement in the amount of on-current of VGAA TFET 200 allows TFET implication in logic to be fulfilled. The low-k spacer 318 minimizes the impact of the gate electric field on the source region 212 at the source-channel junction. In general, the pocket and low-k spacer contribute to a significant increase in on-current.

Figure 16:
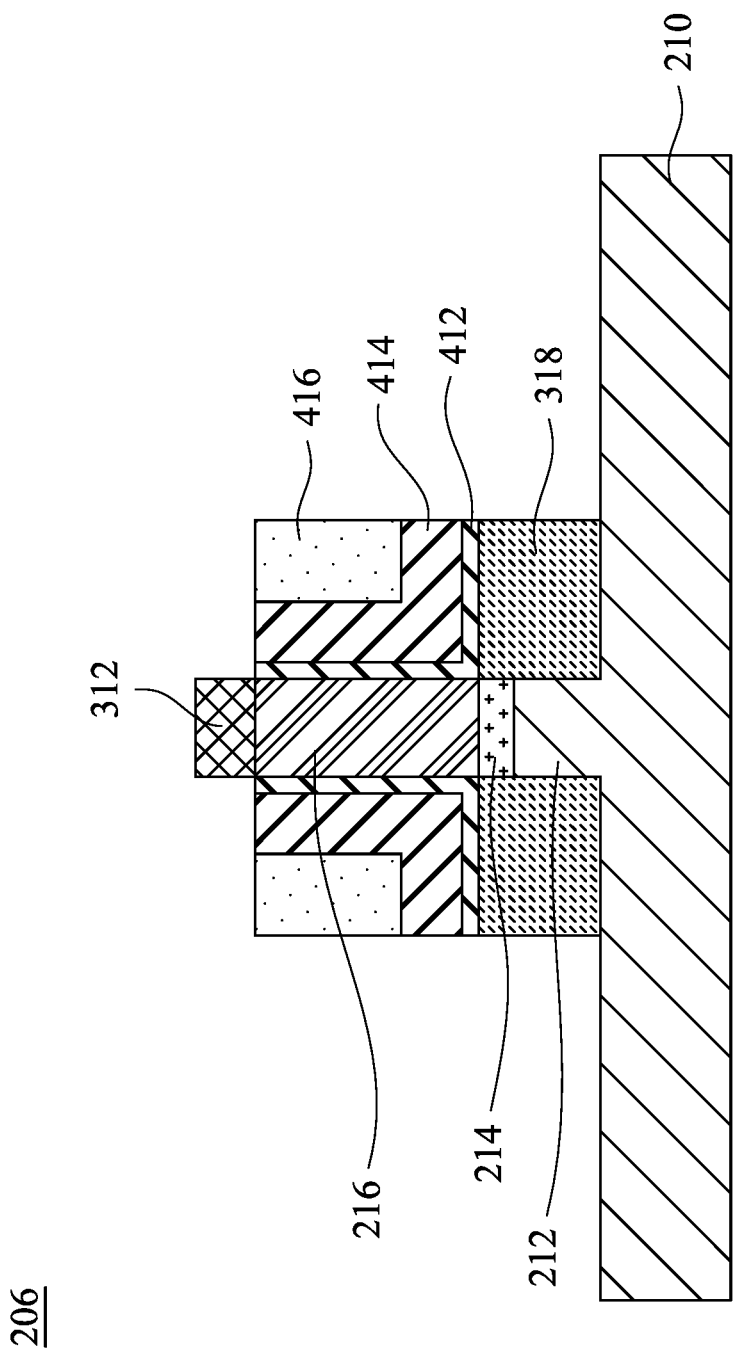

Reference is made to FIG. 16. In some embodiments, the drain region 312 of the VGAA TFET 206 is not surrounded by the low-k spacer 418, while the low-k spacer 318 wraps around the source region 212. With a single low-k spacer 318, a reduction in source depletion is also effective.

Figure 17:
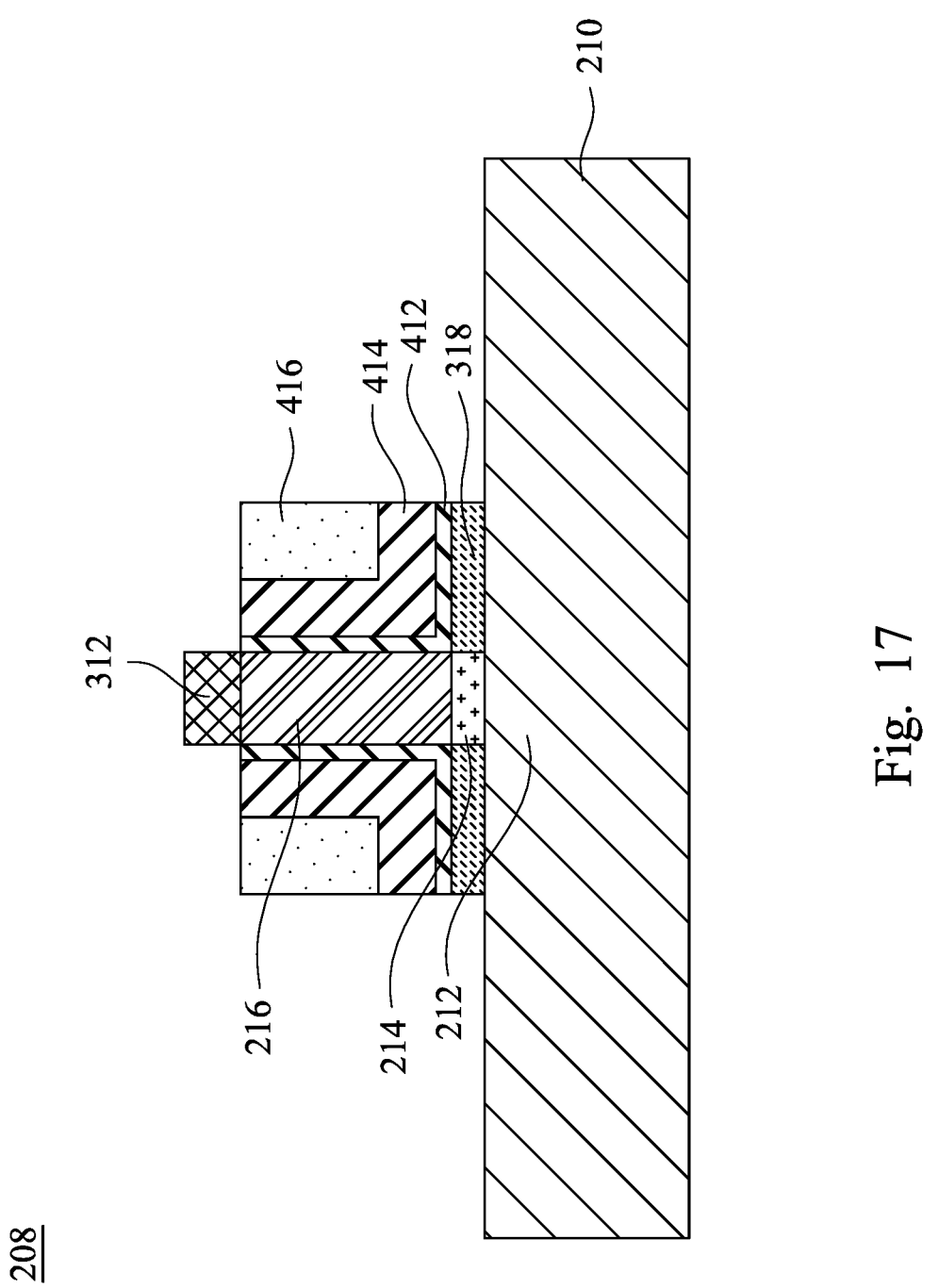

Reference is made to FIG. 17. In some embodiments, the source region 212 and drain region 312 of the VGAA TFET 208 are not encircled by the low-k spacers 318 and 418. The low-k spacer 318 is much thinner and encircles the pocket 214, and the source region 212 is not encircled by the low-k spacer 318. The source region 212 is released from the envelope of the low-k spacer 318. In some embodiments, the low-k spacer 318 may have even thinner profile, and a portion of the pocket 214 is free from the coverage of the low-k spacer 318.

Figure 18:
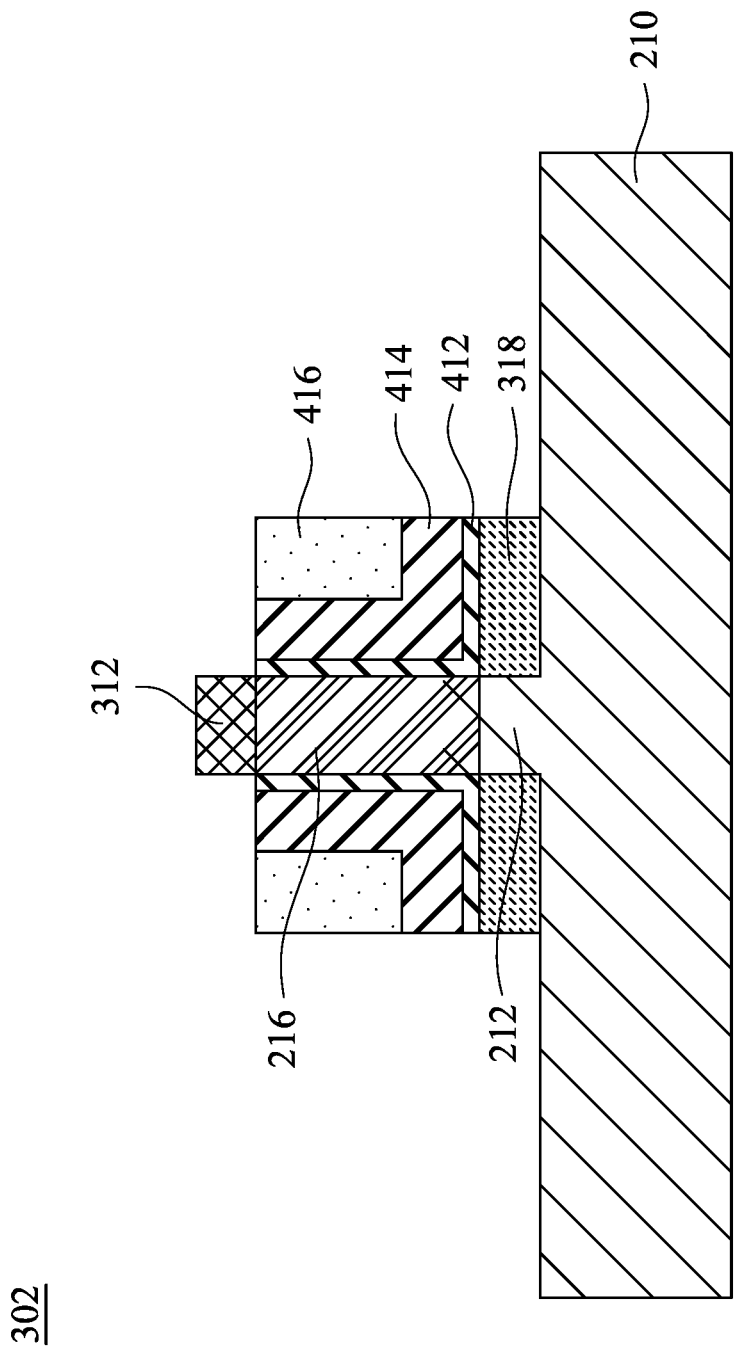

Reference is made to FIG. 18. In some embodiments, the pocket 214 is omitted in the VGAA TFET 302. The epitaxial process 202 is not performed, and the lower semiconductor substrate 210 has moderately doped source region 212. The channel region 216 is formed on the moderately doped source region 212. The low-k spacer 318 is encircles a portion of the source region 212, and the remaining source region 212 is a portion of the lower semiconductor layer 210.

Figure 19:
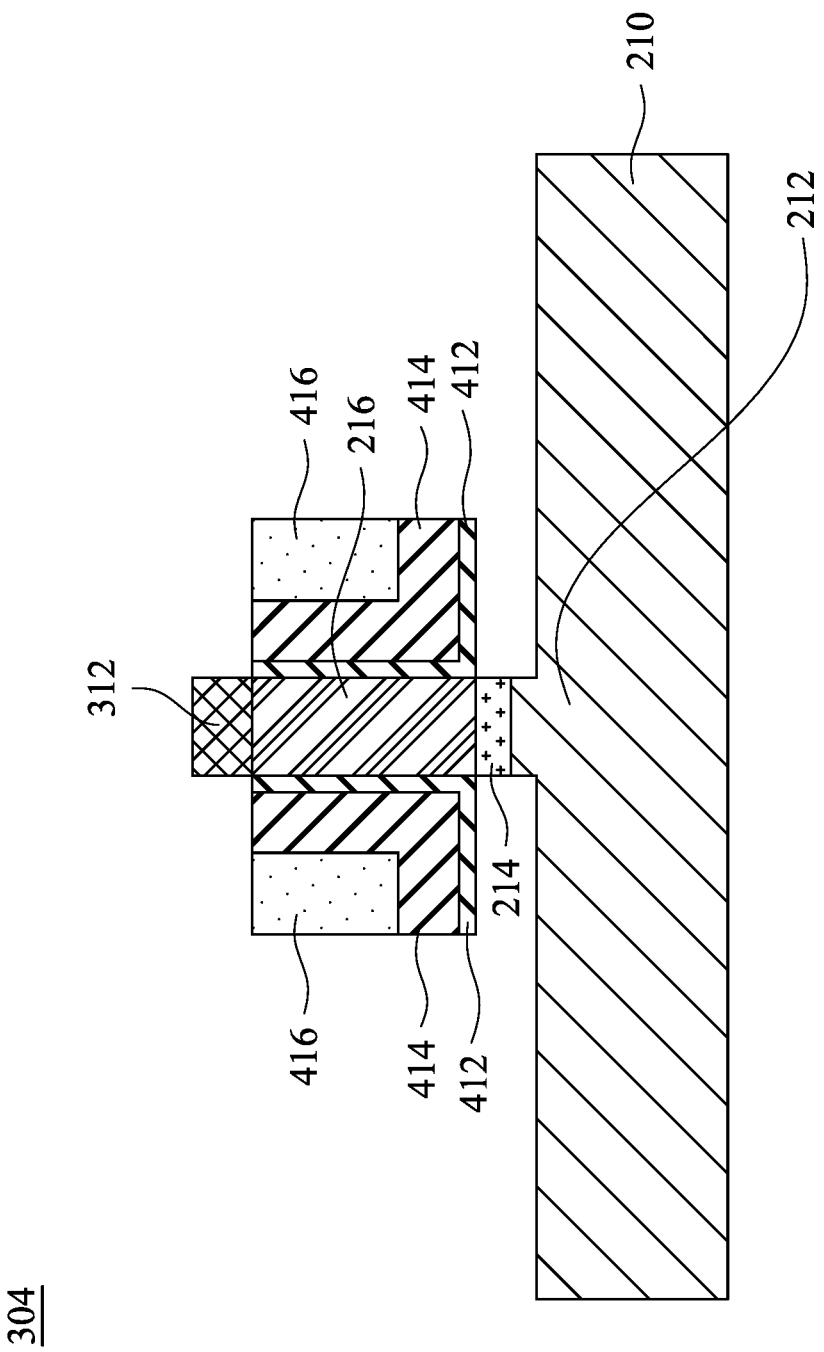

Reference is made to FIG. 19. In some embodiments, the low-k spacers 318 and 418 are omitted in the VGAA TFET 304, while the pocket 214 is formed between the source and channel junction. The spaces left by the low-k spacers 318 and 418 may be filled by interlayer dielectric layer.

FIGS. 20-32 illustrate cross-sectional view of an exemplary vertical gate-all-around (VGAA) TFET 400 being either p-type VGAA TFET or n-type VGAA TFET in accordance with some embodiments. VGAA TFET 400 has a vertical channel region, and a gate dielectric layer and a gate electrode encircling the vertical channel region. The source region has a heavily doped pocket at closer to the channel region. Furthermore, a semiconductor shell wraps around the channel region, interposed between the gate dielectric layer and the channel region, and a low-k spacer forms a ring over the source region, and a barrier layer is formed between the channel region and the drain region.

Figure 20:
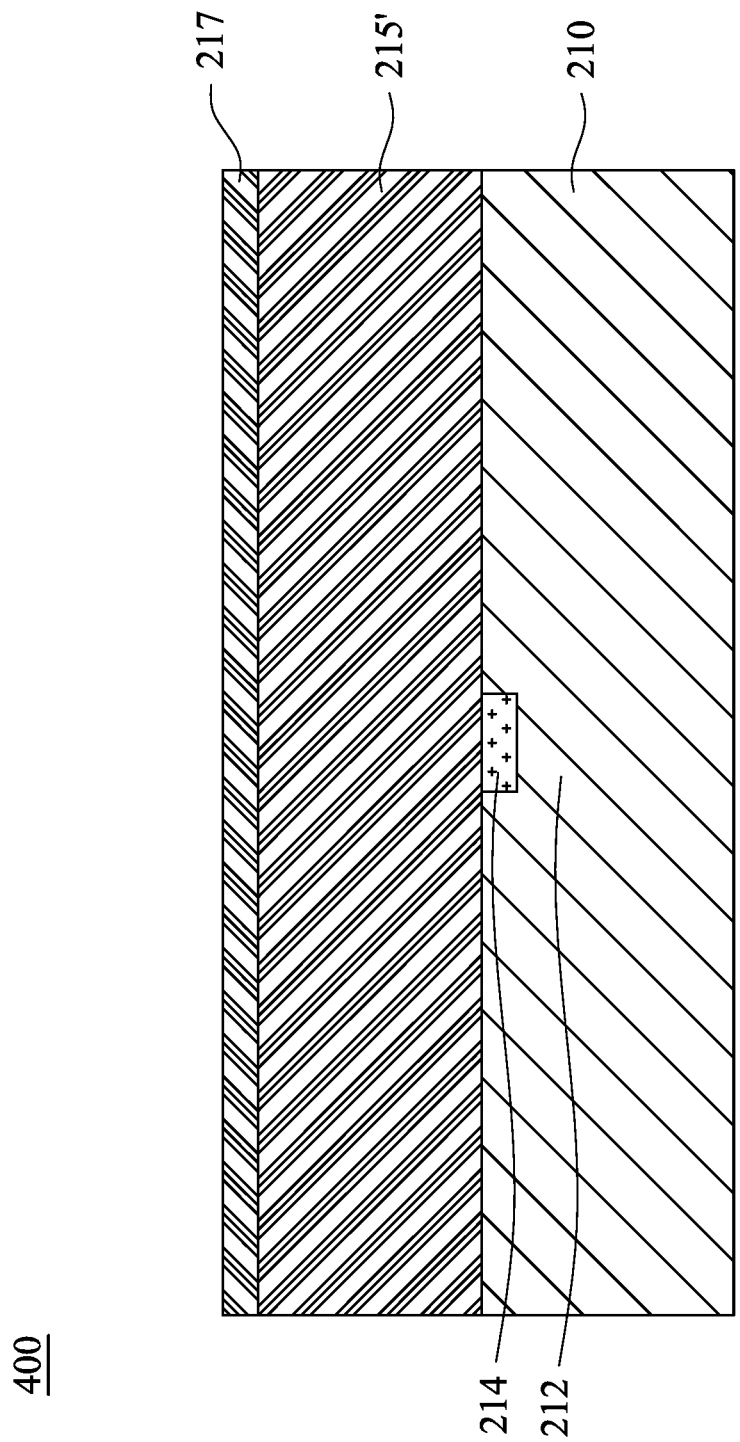
FIGS. 20-32 are cross-sectional views of a portion of a semiconductor device at various stages in a low-k spacer formation process in accordance with some embodiments of the instant disclosure.

Reference is made to FIG. 20 and operation 110 in FIG. 1. A nanowire layer 215' is deposited on the lower semiconductor layer 210. The nanowire layer 215' is blanket deposited on a top surface of the lower semiconductor layer 210. In some embodiments, various epitaxies may be performed to form the nanowire layer 215'. Any suitable epitaxy processes may be used, such as by MO CVD, MBE, LPE, VPE, SEG, combinations thereof, or the like. The nanowire layer 215' can be seen as an extension of the source region 212. Unlike the intrinsic VGAA TFET 200, the nanowire layer 215' of VGAA TFET 400 is doped with a first type dopant. The nanowire layer 215' has the same type of dopant as the source region 212. In some embodiments, the nanowire layer 215' has the same dopant concentration as the source region 212. For example, if the source region 212 has a first type dopant concentration between about a few $1E18/cm^3$ to a few $1E19/cm^3$, the nanowire layer 215' has the same first type dopant concentration between about a few $1E18/cm^3$ to a few $1E19/cm^3$. In some embodiments, the channel region 216 is heavily doped or doped beyond saturation with the first type dopant like the pocket 214. The nanowire layer 215' is patterned into the channel region in subsequent process. The pocket 214 is interposed between the nanowire layer 215' and the source region 212. The pocket 214 is in direct contact with the nanowire layer 215'. The nanowire layer 215' includes semiconductor materials.

Reference is made to FIG. 20. A tunnel barrier material layer 217 is deposited on the nanowire layer 215'. The tunnel barrier material layer 217 may be formed using an epitaxy process, such as MOCVD, MBE, LPE, VPE, SEG, combinations thereof, and the like The tunnel barrier material layer 217 includes a semiconductor material that is able to supress axial tunnelling. For example, the nanowire layer 215' may include InAs/GaSb, and the tunnel barrier material layer may include $In_xGa_{1-x}As$, where x is smaller than 1. In some embodiments, the tunnel barrier material layer has more gallium inclined semiconductor material with x of approximately 0.

Figure 21:
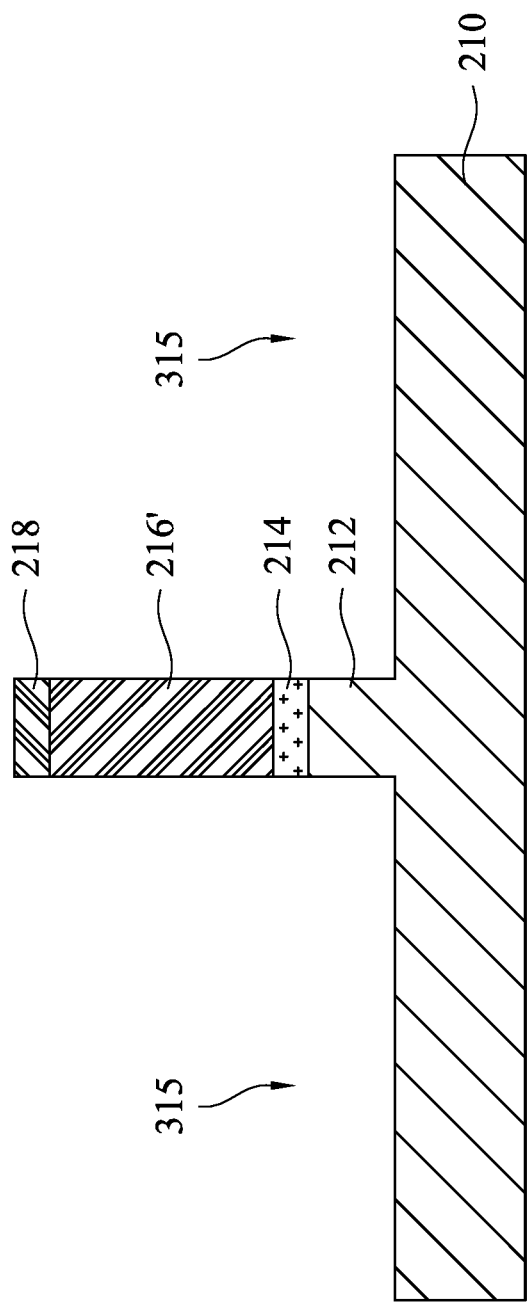

Reference is made to FIG. 21. The VGAA TFET 400 undergoes patterning process to form a column. An etching process either wet etch or dry etch is performed to remove layers exposed from the hard mask (not shown). After patterning, the channel region 216' is standing on the source region 212, and the tunnel barrier layer 218 is on the other end of the channel region 216'. The source region 212 and the tunnel barrier layer 218 are on opposing sides of the channel region 216'. The channel region 216' is sandwiched between the source region 212 and the tunnel barrier layer 218. The pocket 214 is at the junction where the source region 212 and the channel region 216' meet.

Reference is still made to FIG. 21. Portion of the lower semiconductor layer 210 is removed in the patterning process such that the source region 212 becomes a protruded portion on the lower semiconductor layer 210 as shown in FIG. 21. The patterning process results in a narrow semiconductor column extending upwardly from the source region 212. A recess 315 is formed on the lower semiconductor layer 210, and the recess 315 is where the spacer will be formed in subsequent process.

Figure 22:
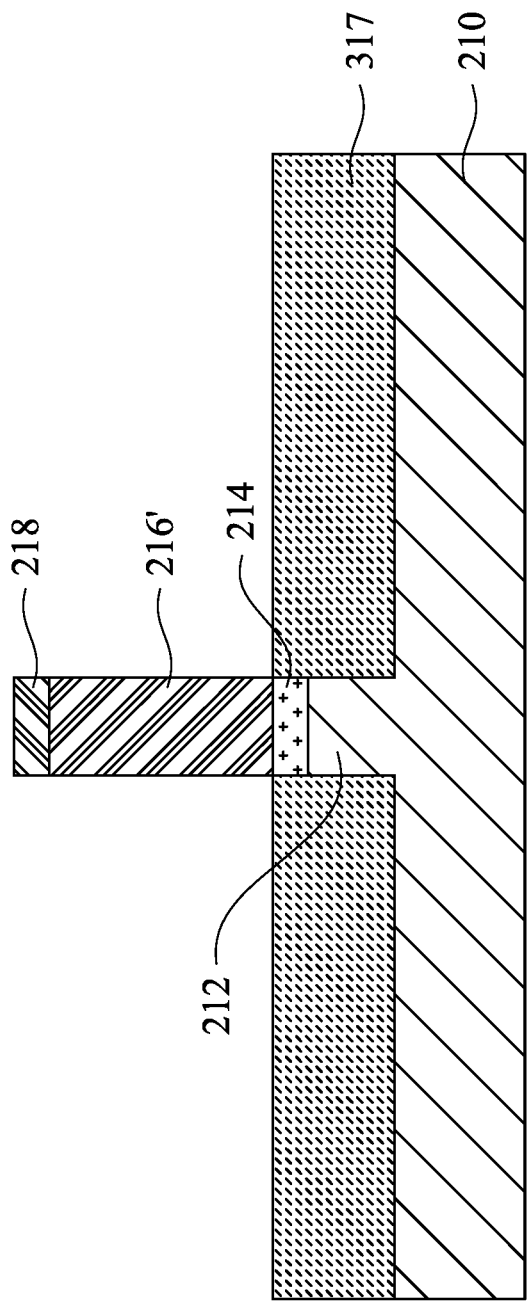

Reference is made to FIG. 22 and operation 140 in FIG. 1. A low-k spacer material 317 is deposited in the recess 315 on the lower semiconductor layer 210. The low-k spacer material 317 encircles the source region 212 and the pocket 214 and blankets the top surface of the lower semiconductor substrate 210. The recess 315 is filled in by the low-k spacer material 317. The low-k spacer material 317 covers a portion of the source region 212 and the pocket 214 and does not cover the remaining portion from the channel region 216' above.

Figure 23:
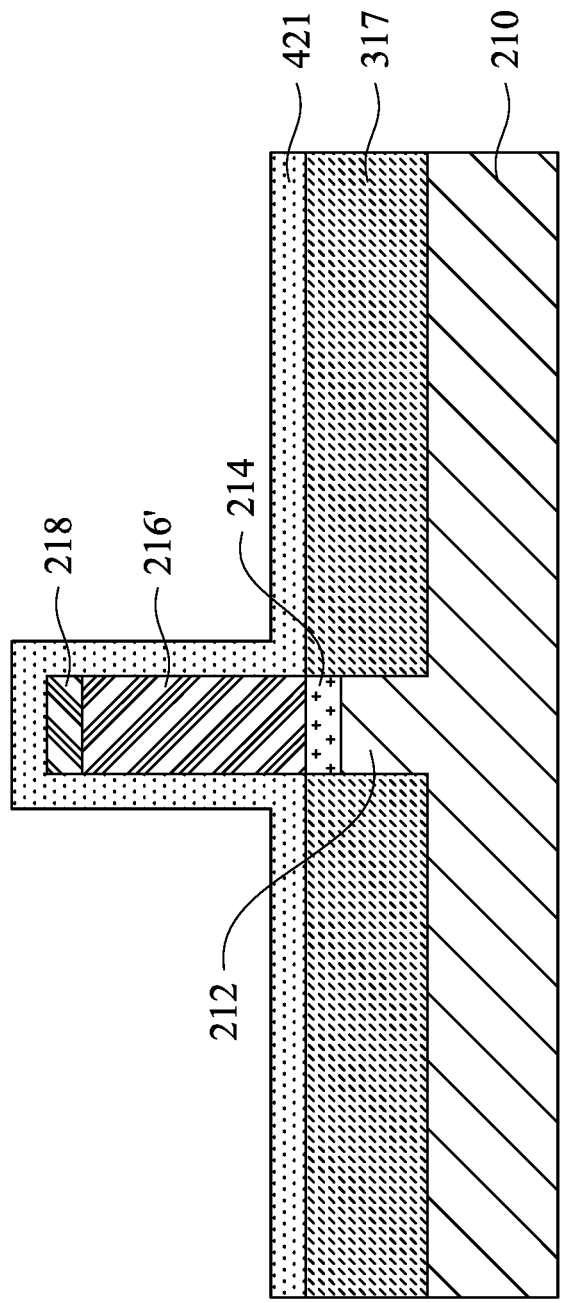

Reference is made to FIG. 23. A semiconductor shell layer 421 is conformally deposited on the column and the top surface of the low-k spacer material 317. The semiconductor shell layer 421 includes the same semiconductor material as the channel region 216', while the semiconductor shell layer 421 is intrinsic. The semiconductor shell layer 421 reproduces the outline of the column which includes the channel region 216' and the tunnel barrier layer 218.

Figure 24:
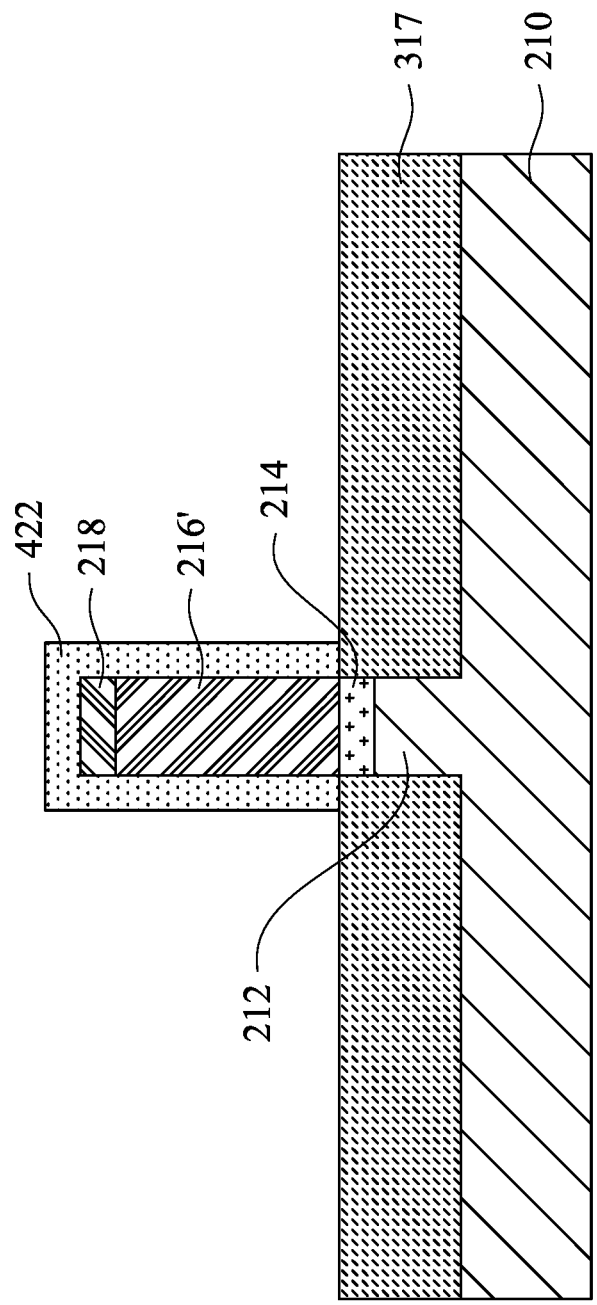

Reference is made to FIG. 24. The semiconductor shell layer 421 undergoes patterning to form the semiconductor shell 422. The semiconductor shell 422 surrounds the channel region 216' and the tunnel barrier layer 218, making an inverted U-shaped shield around the column. Edges of the semiconductor shell 422 are in contact with the low-k spacer material 317. The semiconductor shell 422 does not overlap with the pocket 214.

Figure 25:
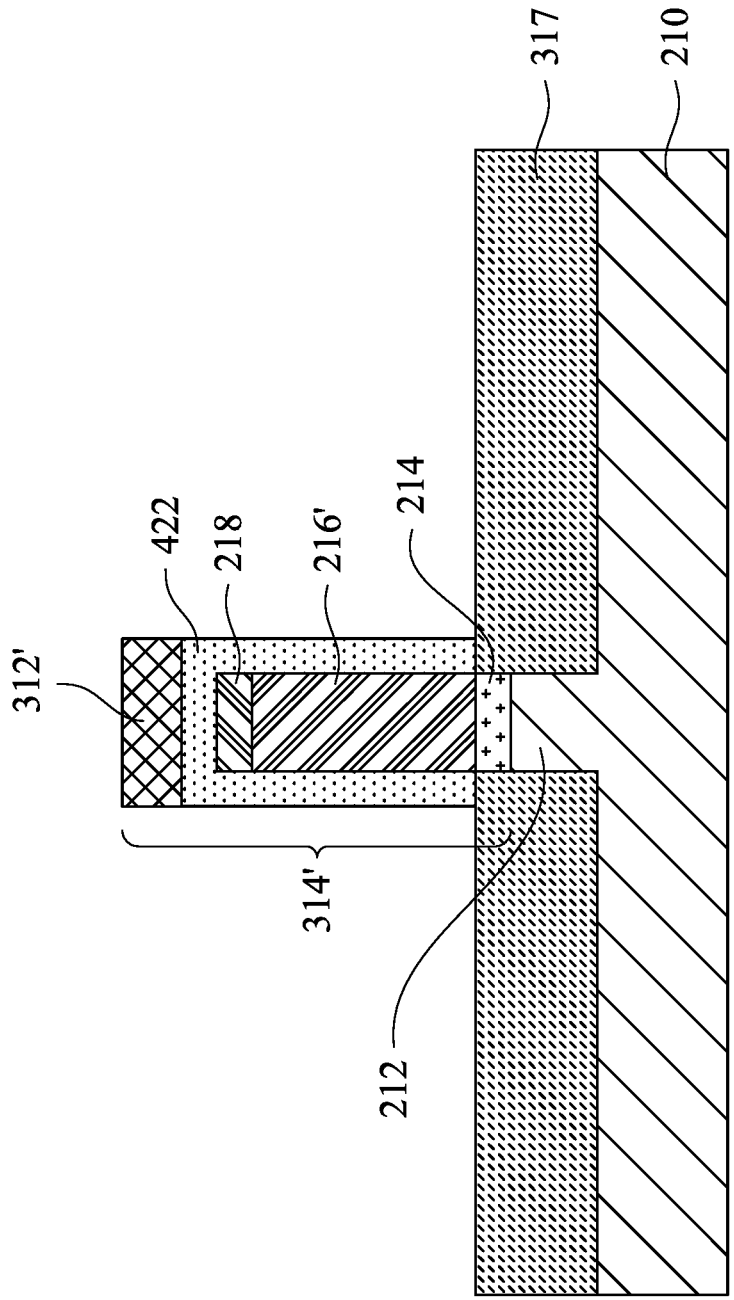

Reference is made to FIG. 25 and operation 110 of FIG. 1. The drain region 312' is formed on the semiconductor shell 422. The drain region 312' may be formed by similar process as previously discussed. The drain region 312' includes a second type semiconductor. The drain region 312' may be moderately doped or a heavily doped with the second type dopant. The drain region 312' may have a dopant concentration ranging between about $1E17/cm^3$ and about $1E21/cm^3$. The drain region 312' is on opposing end of the source region 212 and in direct contact with the semiconductor shell 422. In this configuration, electrons enter the source region 212, pass through the pocket 214 and channel region 216. The tunnel barrier layer 218 blocks the passage of the electrons, and the electrons are diverted to the semiconductor shell 422 and then reach the source region 312'. The drain region 312' has a wider width that at least covers the underlying semiconductor shell 422. The drain region 312' is broader than the source region 212 and the channel region 216'. The source region 212, pocket 214, channel region 216', tunnel barrier layer 218, semiconductor shell 422 and drain region 312' together form a semiconductor column 314'.

Figure 26:
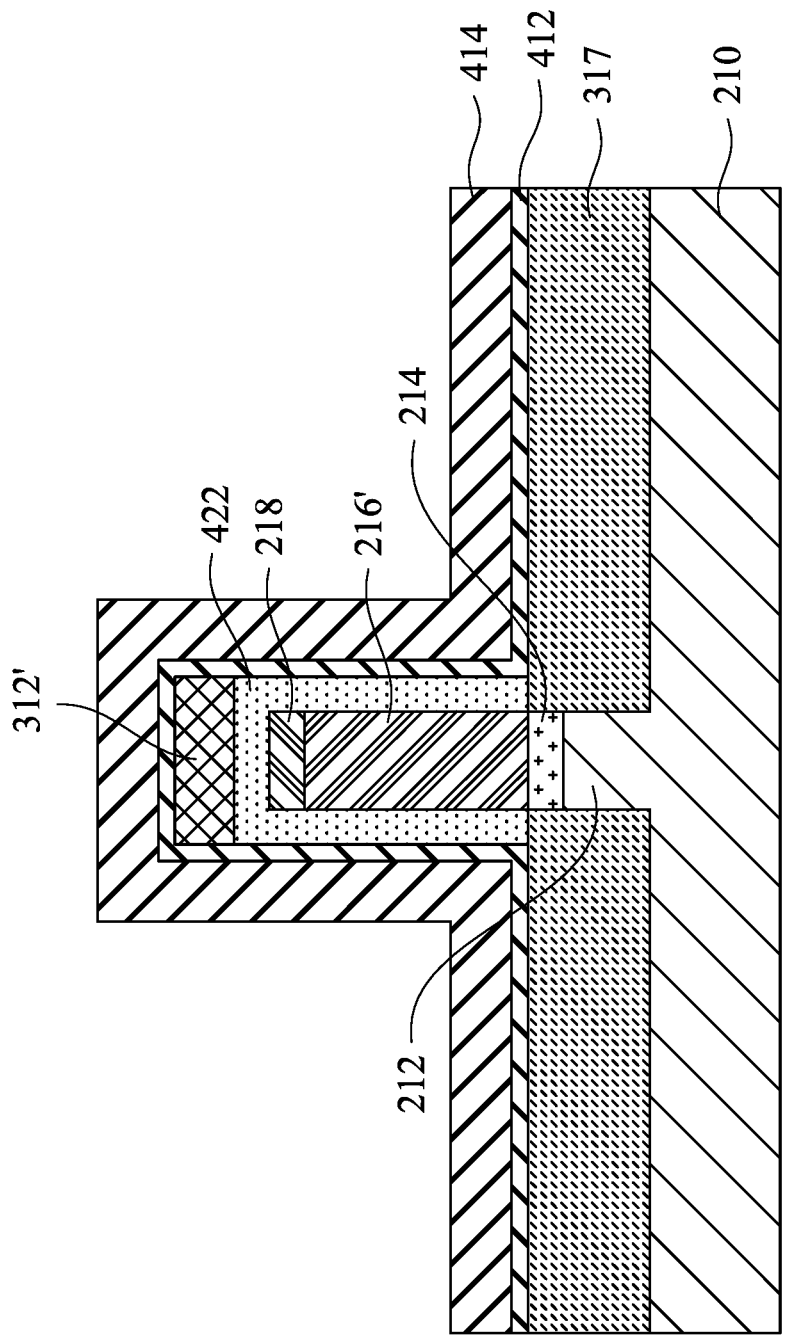

Reference is made to FIG. 26 and operation 150. A gate dielectric layer 412 and a gate electrode 414 are conformally formed on the semiconductor column 314'. The gate dielectric layer 412 blankets the underlying low-k spacer material 317 and goes along the exposed surface of the semiconductor shell 422 and drain region 312'. The protruded semiconductor column 314 is reproduced by the gate dielectric layer 412 and the gate electrode 414. In some embodiments, the gate dielectric layer 412 is high-k dielectric layer (k is larger than 6). The source region 212 and the pocket 214 are free of the gate dielectric layer 412 and the gate electrode 414 because the low-k spacer material 317 occupies the surrounding region of the source region 212 and the pocket 214. The channel region 216' and the tunnel barrier layer 218 are spaced apart from the gate dielectric layer 412 because the semiconductor shell 422 is interposed in between.

Figure 27:
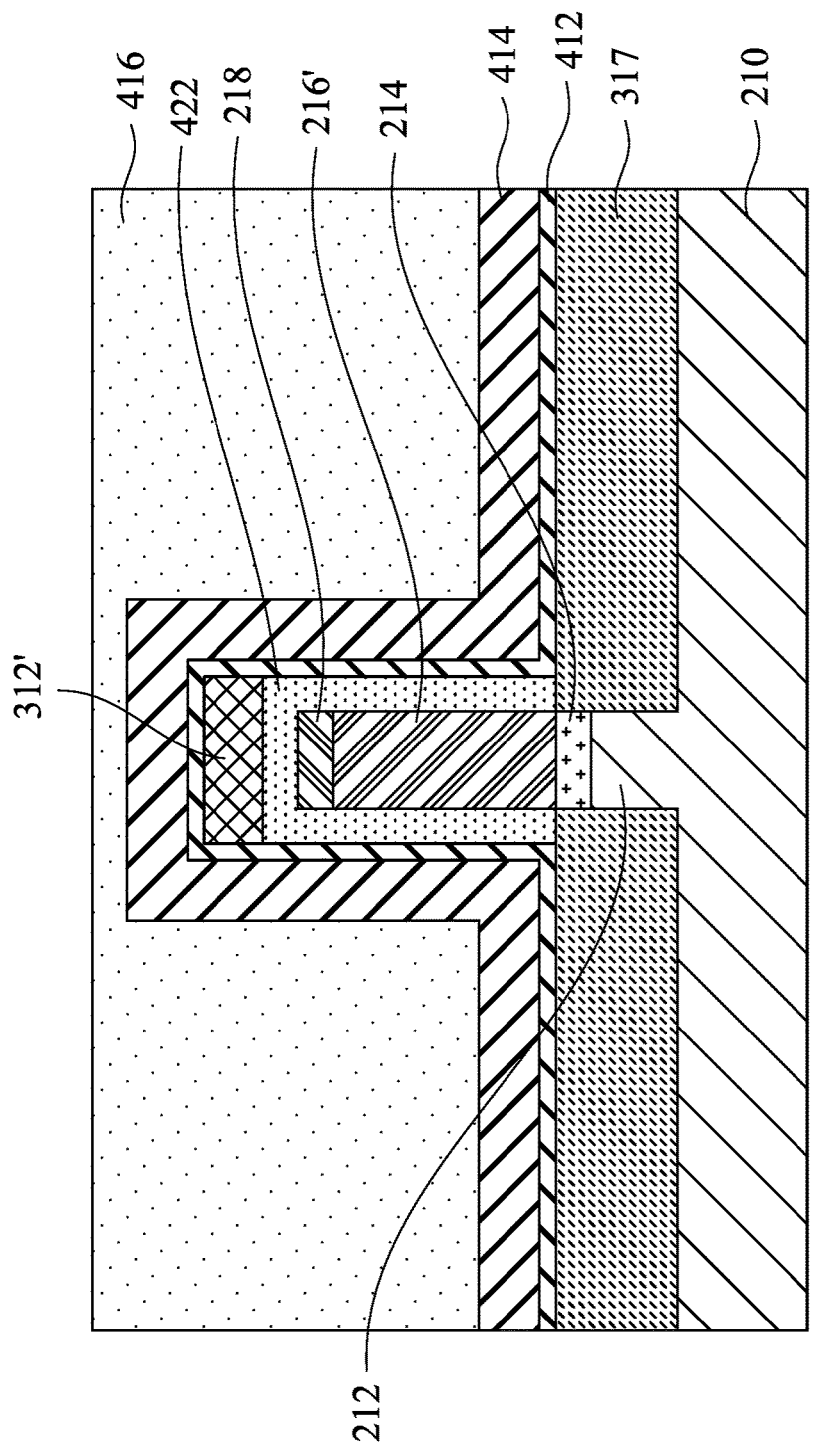

Reference is made to FIG. 27. After the deposition of the gate dielectric layer 412 and the gate electrode 414, an interlayer dielectric layer 416 is deposited. The interlayer dielectric layer 416 blankets the semiconductor column 314' and has a thickness that is sufficient to bury the height of the entire semiconductor column 314' including the drain region 312'.

Figure 28:
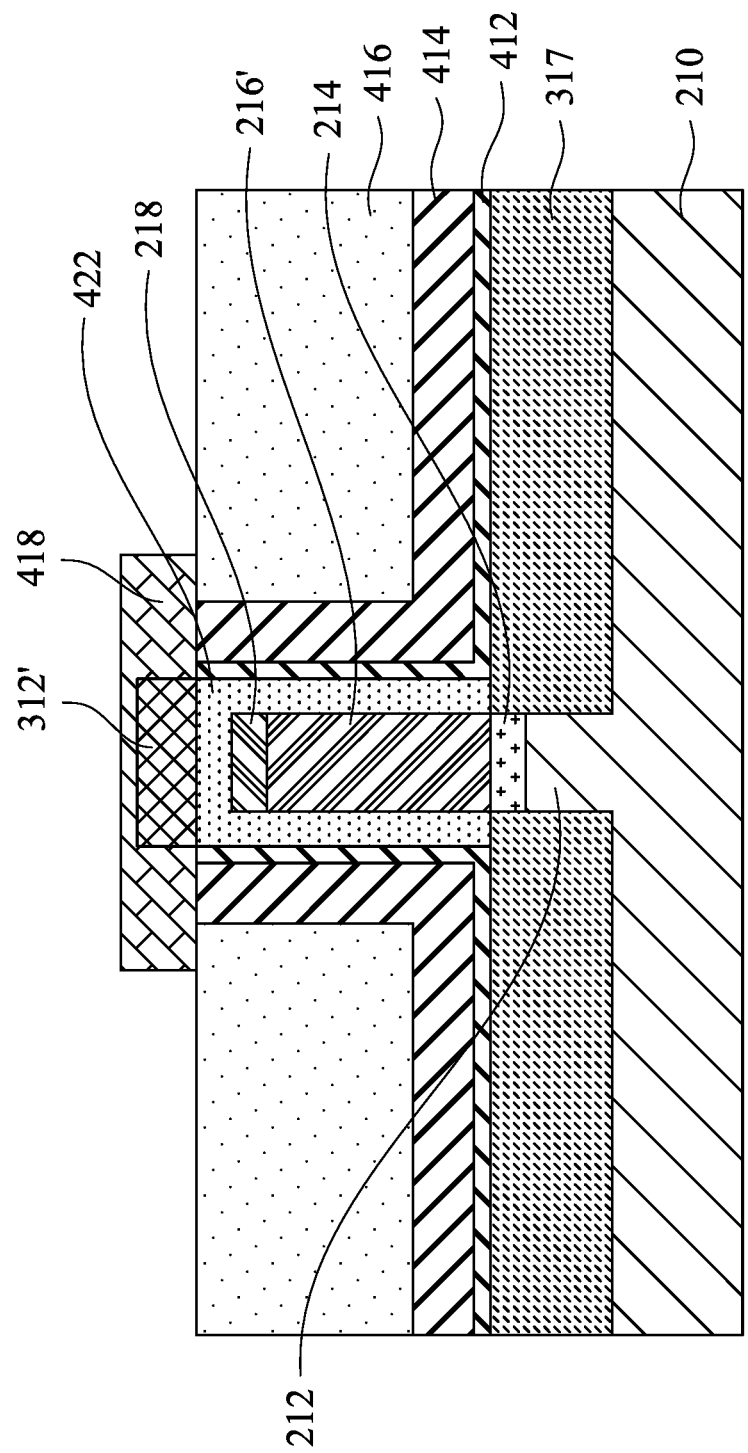

Reference is made to FIG. 28. An etching back is performed to remove a portion of the interlayer dielectric layer 416, gate dielectric layer 412, and gate electrode 414. As shown in FIG. 11, the drain region 312' is released from the coverage of the gate dielectric layer 412, gate electrode 414 and interlayer dielectric layer 416. The tunnel barrier layer 218 and channel region 216' are wrapped around by the gate dielectric layer 412, gate electrode 414 and interlayer dielectric layer 416 in full concentric rings. The drain region 312' is a bump protruding from the top surface of the interlayer dielectric layer 416.

Reference is still made to FIG. 28. A low-k spacer 418 is formed around the drain region 312'. The low-k spacer 418 encircles the drain region 312'. The drain region 312', gate dielectric layer 412, gate electrode 414 and a portion of the interlayer dielectric layer 416 are under the coverage of the low-k spacer 418. The remaining portion of the interlayer dielectric layer 416 is exposed.

Figure 29:
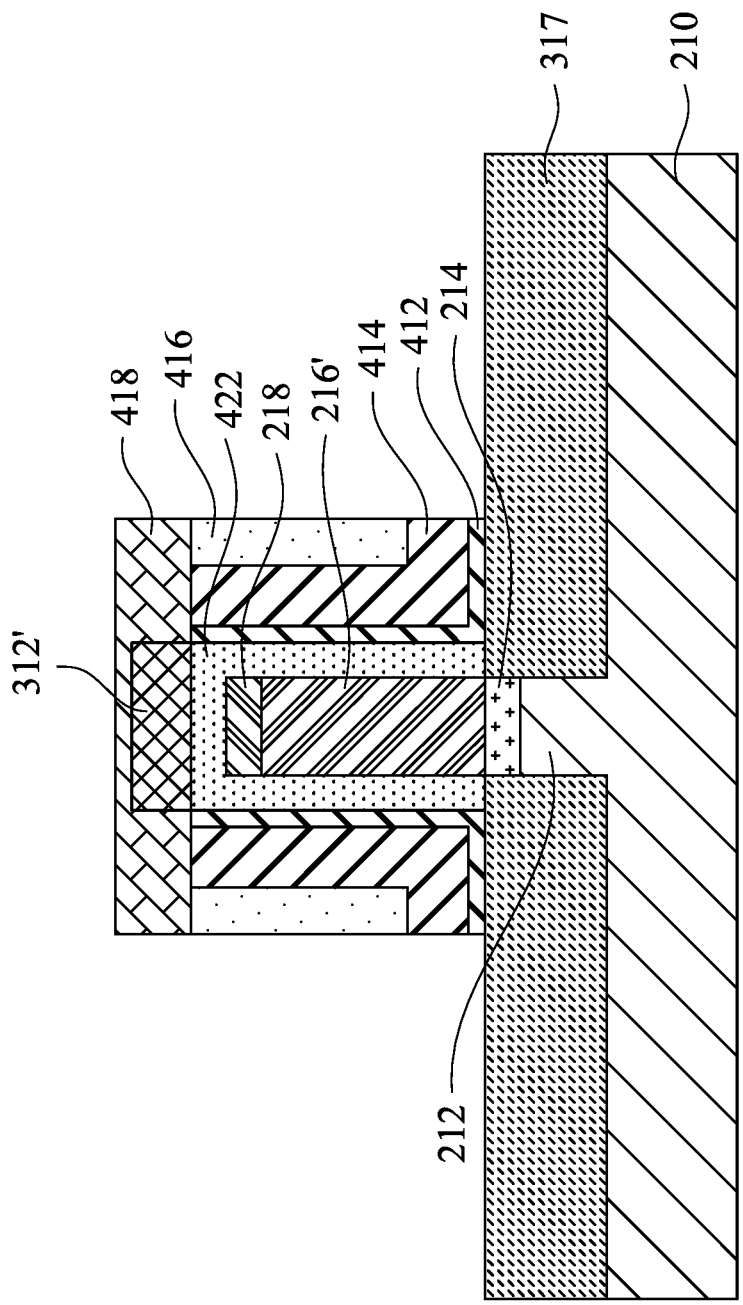

Reference is made to FIG. 29. The low-k spacer 418 is used as a mask layer in a subsequent patterning process to trim the materials exposed from its coverage. The portion of the interlayer dielectric layer 416 that is not covered by the low-k spacer 418 is removed during the patterning process. The gate dielectric layer 412 and gate electrode 414, which are underlying the exposed interlayer dielectric layer 416, are removed. After patterning, the gate dielectric layer 412 and the gate electrode 414 are in a shape of "L". The low-k spacer material 317 may serve as an etch stop layer in the patterning process, and the top surface of the low-k spacer material 317 is exposed. The components underlying the low-k spacer 418 are retained after the patterning process.

Figure 30:
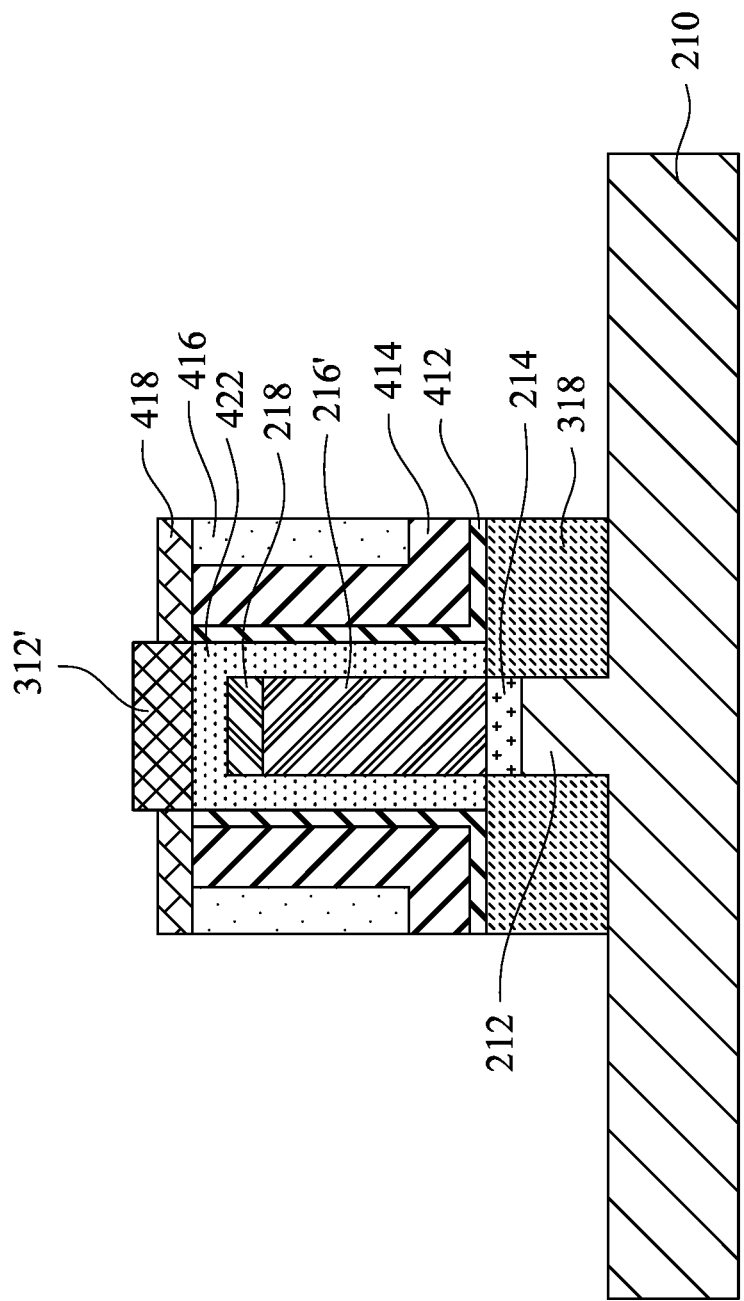

Reference is made to FIG. 30. Excess low-k spacer material 317 is then removed to form the low-k spacer 318, and a VGAA transistor is complete. The VGAA TFET 400 has the pocket 214 between the source region 212 and channel region 216. The pocket 214 is heavily doped with the same type of dopant as the source region 212. The insertion of the pocket 214 minimizes source depletion, and therefore an increase of on-current ($I_{on}$) level can be obtained. The improvement in the amount of on-current of VGAA TFET 400 allows TFET implication in logic to be fulfilled. The tunnel barrier layer 218 is inserted between the channel region 216' and the drain region 312' and is there to suppress the parasitic axial BTBT current that will lead to leakage. The channel region 216' may be seen as an extension of the source region 212 because the channel region 216' has the same type dopant as the source region 212. The semiconductor shell 422 that surrounds the channel region 216' and the tunnel barrier layer 218 is intrinsic. Electrons follow a path that goes from the source region 212, through the pocket 214, channel region 216' and then are blocked by the tunnel barrier layer 218. Electrons therefore change direction to the semiconductor shell 422 which is intrinsic and in direct contact with the drain region 312' and then arrive the drain region 312' through the semiconductor shell 422. The low-k spacer 318 minimizes the impact of the gate electric field on the source region 212 at the source-channel junction. In general, the pocket, tunnel barrier layer, semiconductor shell and low-k spacer contribute to an increase in on-state current and a reduction in off-state current. The device performance is greatly improved.

Figure 31:
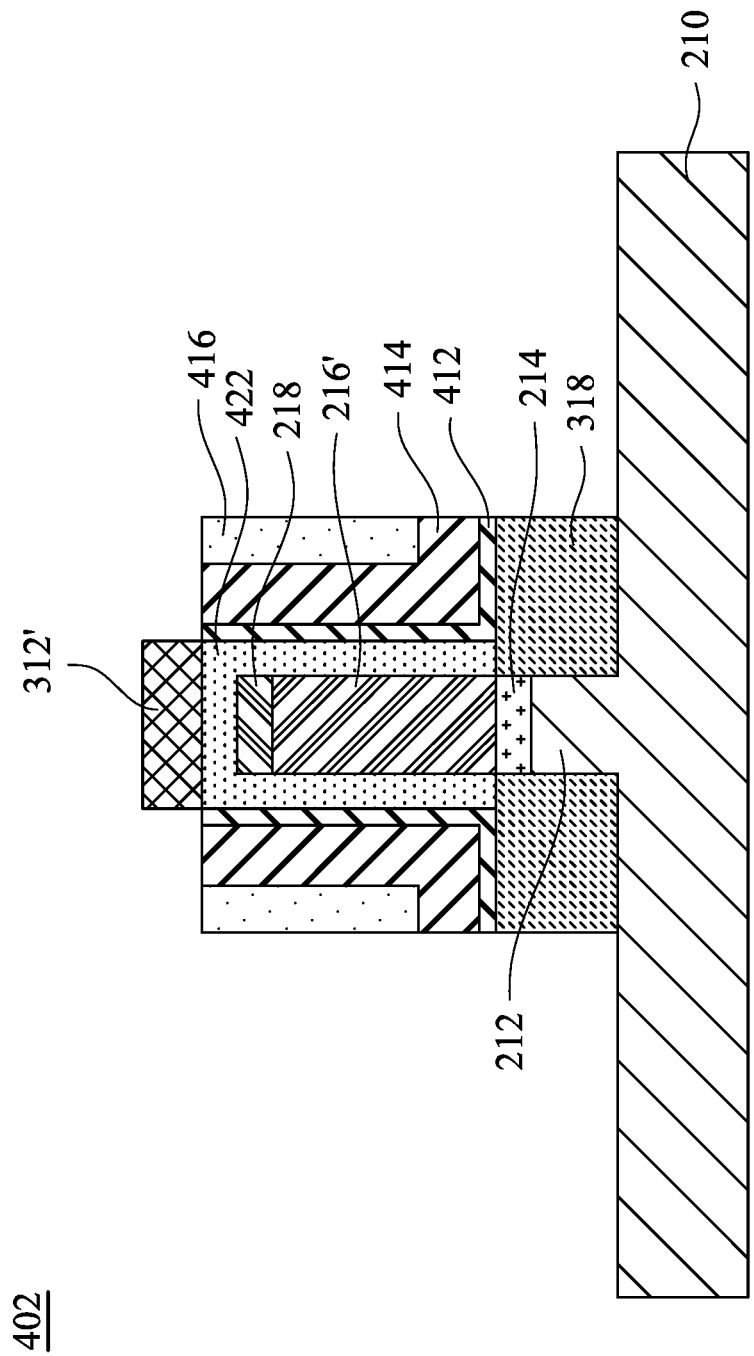

Reference is made to FIG. 31. In some embodiments, the drain region 312' of the VGAA TFET 402 is not surrounded by the low-k spacer 418, while the low-k spacer 318 wraps around the source region 212. With a single low-k spacer 318, a reduction in source depletion is also effective.

Figure 32:
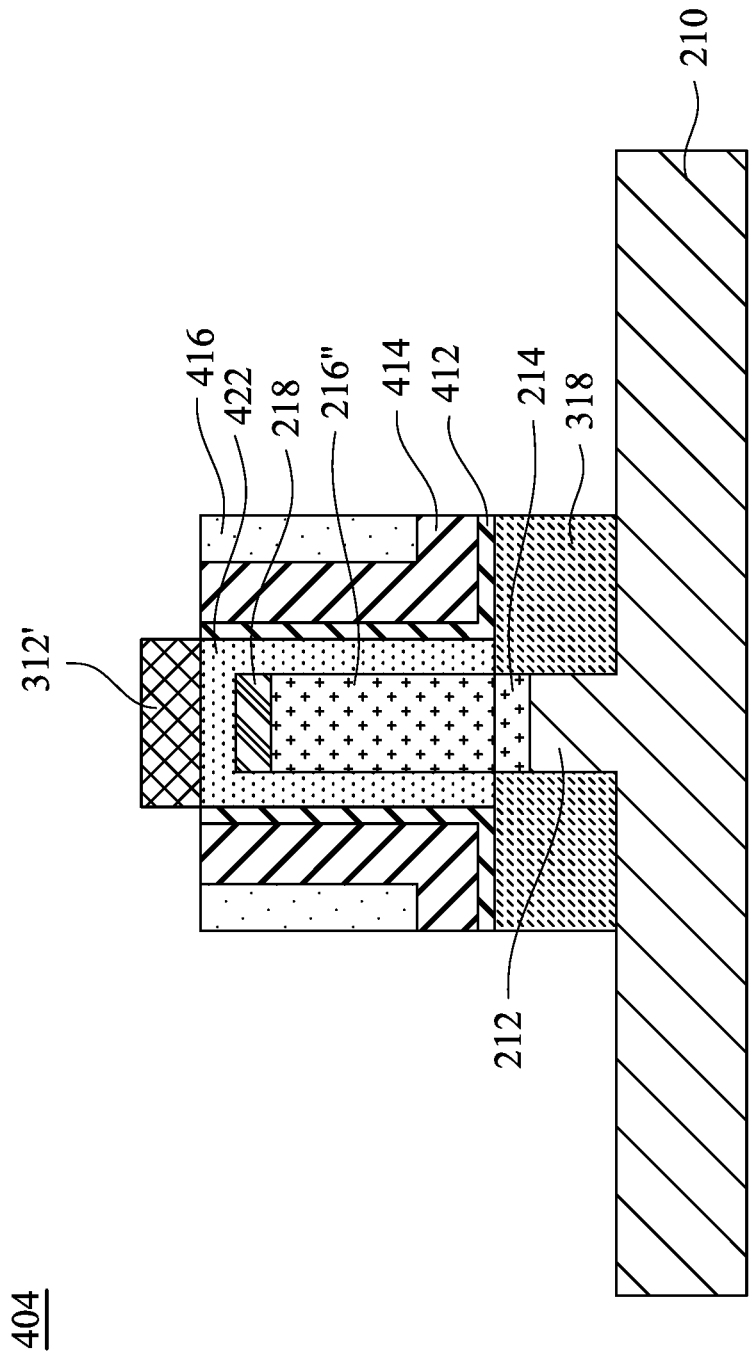

Reference is made to FIG. 32. In some embodiments, the channel region 216" of the VGAA TFET 404 has the same dopant concentration as the pocket 214. The channel region 216" may be heavily doped or doped beyond saturation of the first type dopant.

FIGS. 33-45 are cross-sectional views illustrating an exemplary FinTFET 500 being either p-type FinTFET or n-type FinTFET in accordance with some embodiments. FinTFET 500 has a doped channel region, and a semiconductor shell encircles a portion of the channel region. The semiconductor shell is between the channel region and the drain region. The source region has a heavily doped pocket closer to the channel region. Furthermore, a low-k spacer forms over source region.

Figure 33:
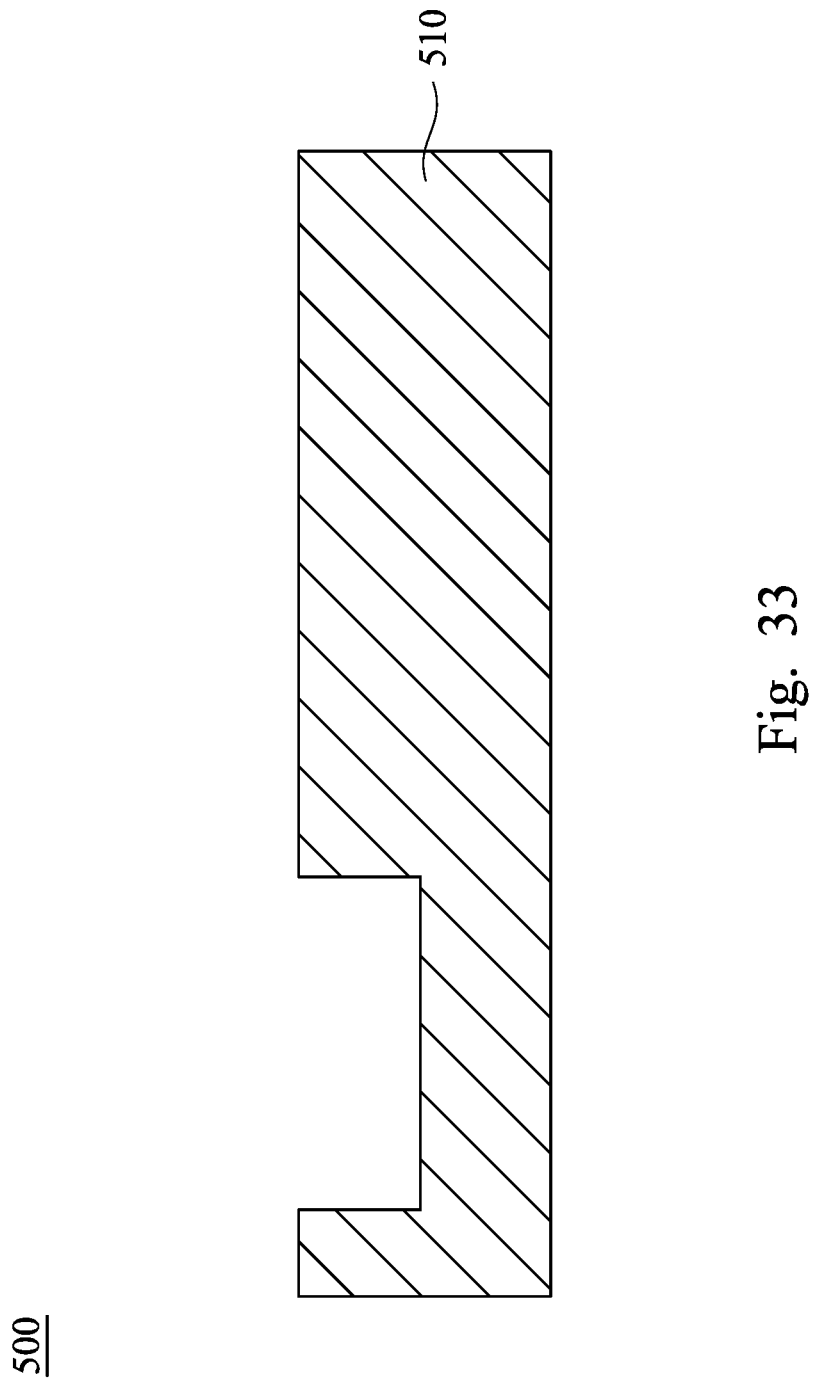
FIGS. 33-45 are cross-sectional views of a portion of a semiconductor device at various stages in a low-k spacer formation process in accordance with some embodiments of the instant disclosure.

Reference is made to FIG. 33 and operation 110 in FIG. 1. A semiconductor substrate 510 is etched to form a recess. The semiconductor substrate 510 may be formed of bulk crystalline silicon. In alternative embodiments, semiconductor substrate 510 includes silicon germanium, silicon carbon, or other semiconductor materials. Semiconductor substrate 510 may also have a Silicon-On-Insulator (SOI) structure in some embodiments.

Figure 34:
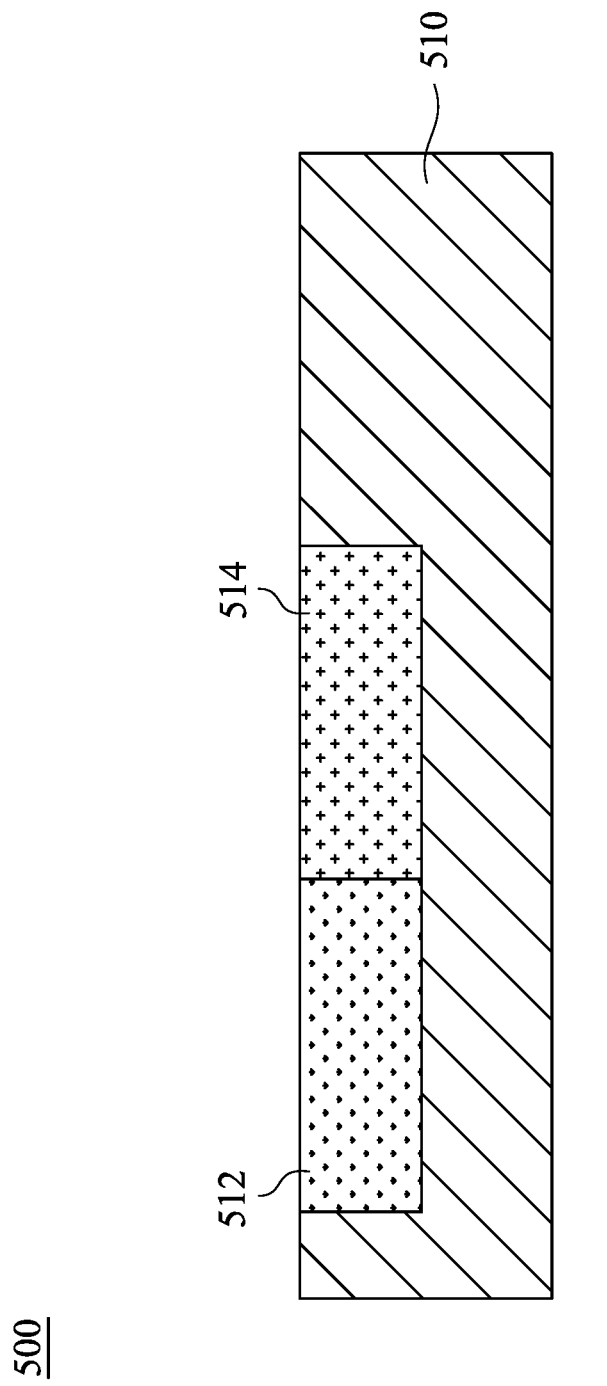

Reference is made to FIG. 34 and operation 110 of FIG. 1. Source region 512 is formed in the recess of the semiconductor substrate 510 using an epitaxy process, such as MOCVD, MBE, LPE, VPE, SEG, combinations thereof, and the like. The source region 512 includes a first type semiconductor. Examples of the first type semiconductor may include group IV materials such as Si, Ge, C and binary compounds thereof, or Group III-V materials such as In, Ga, As, Sb, Al, P, B, N and binary, tertiary and quaternary compounds. For example, the source region 512 may include GaSb.

Reference is still made to FIG. 34 and operation 110 of FIG. 1. A channel region 514 is formed in line with the source region 512. The channel region 514 includes a first type semiconductor. The channel region 514 may be seen as an extension of the source region 512.

Reference is still made to FIG. 34 and operation 120 of FIG. 1. The source region 512 and the channel region 514 have a first type dopant. In some embodiments, in which the FinTFET 500 is an n-type transistor, the first type dopant is a p-type dopant. In some embodiments, in which the FinTFET 500 is a p-type transistor, the first type dopant in the source region 512 is an n-type dopant. The source region 512 and channel region 514 may be moderately doped. The source region 512 and channel region 514 may have a dopant concentration ranging between about $1E17/cm^3$ and about $1E19/cm^3$. In some embodiments, the first type dopant concentration in the source region 512 and channel region 514 is lower than about $1E19/cm^3$.

Figure 35:
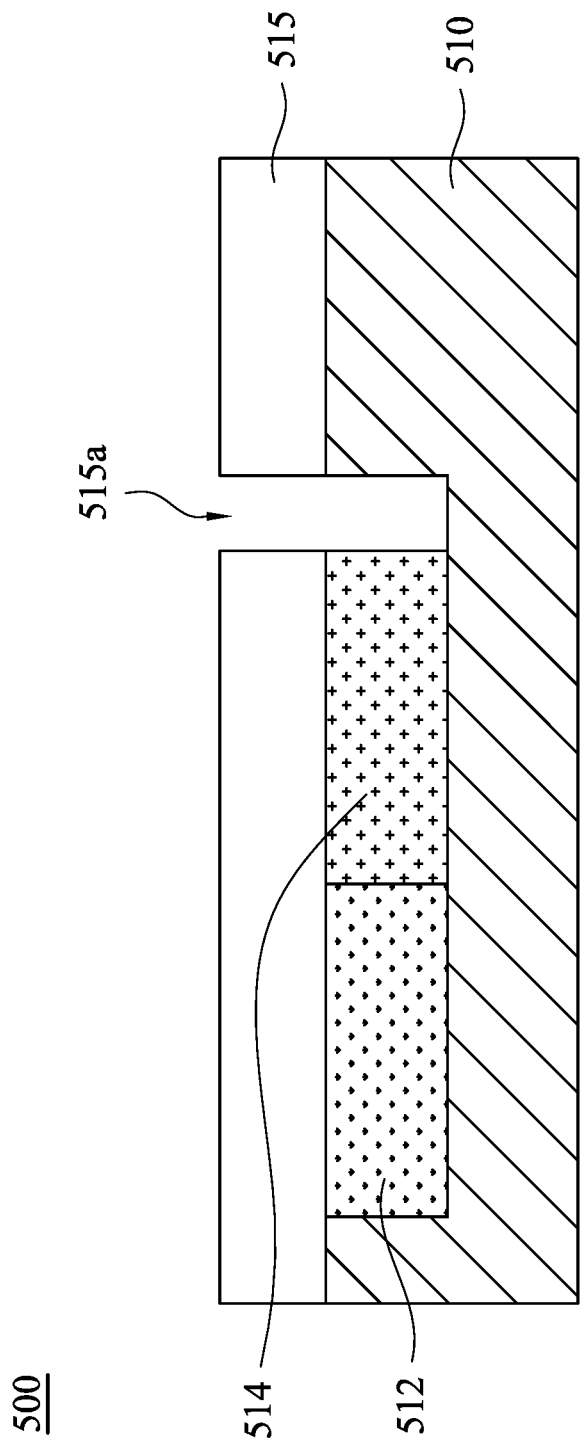

Reference is made to FIG. 35. A mask layer 515 is deposited on the FinTFET 500 over the source region 512 and channel region 514. An opening 515a is formed in the mask layer 515. The opening 515a exposes a portion of the semiconductor substrate 510 which is adjacent to the channel region 514. An etching process is performed to remove the exposed portion of the semiconductor substrate 510, and a recess is formed.

Figure 36:
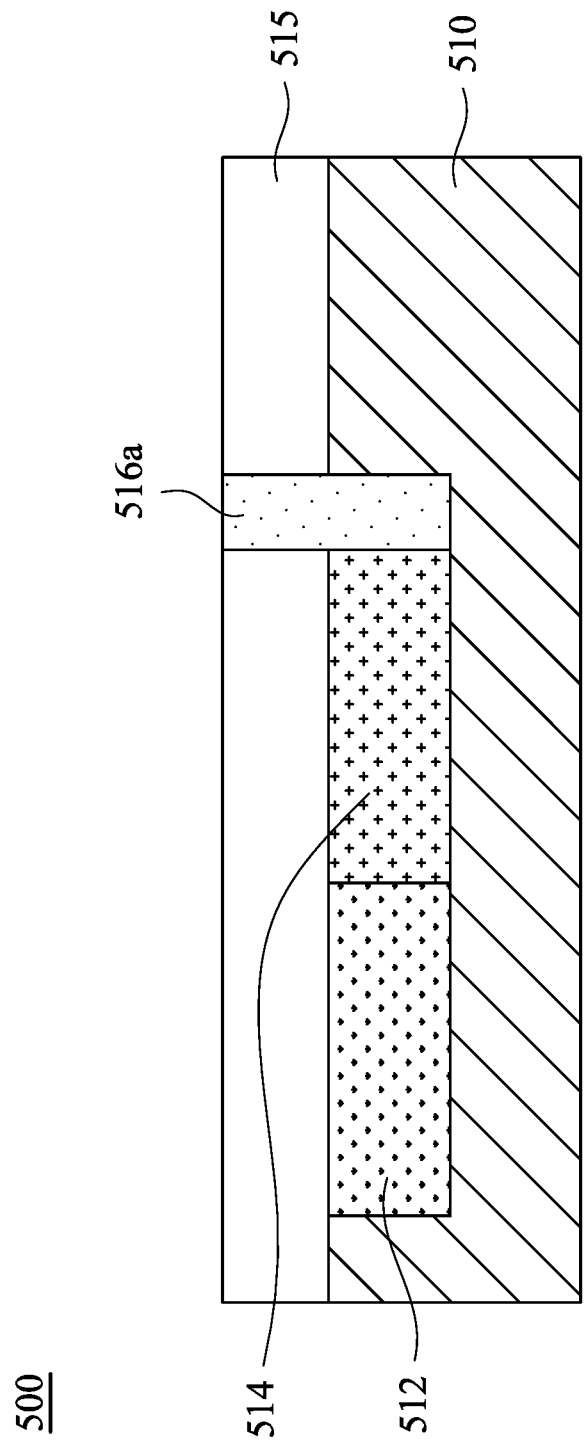

Reference is made to FIG. 36. A tunnel barrier material 516a is deposited in the opening 515a. The tunnel barrier material 516a includes a semiconductor material that is able to suppress the parasitic axial BTBT current that will lead to leakage. For example, the channel region 514 may include InAs/GaSb, and the tunnel barrier material 516a may include $In_xGa_{1-x}As$, where x is smaller than 1. In some embodiments, the tunnel barrier material 516a has more gallium inclined semiconductor material with x of approximately 0. The mask layer 515 is then removed along with the excess tunnel barrier material 516a that is protruding over a top surface of the FinTFET 500 to form the tunnel barrier layer 516. The tunnel barrier layer 516 is in line with the channel region 514. The channel region 514 is now sandwiched between the tunnel barrier layer 516 and the source region 512.

Figure 37:
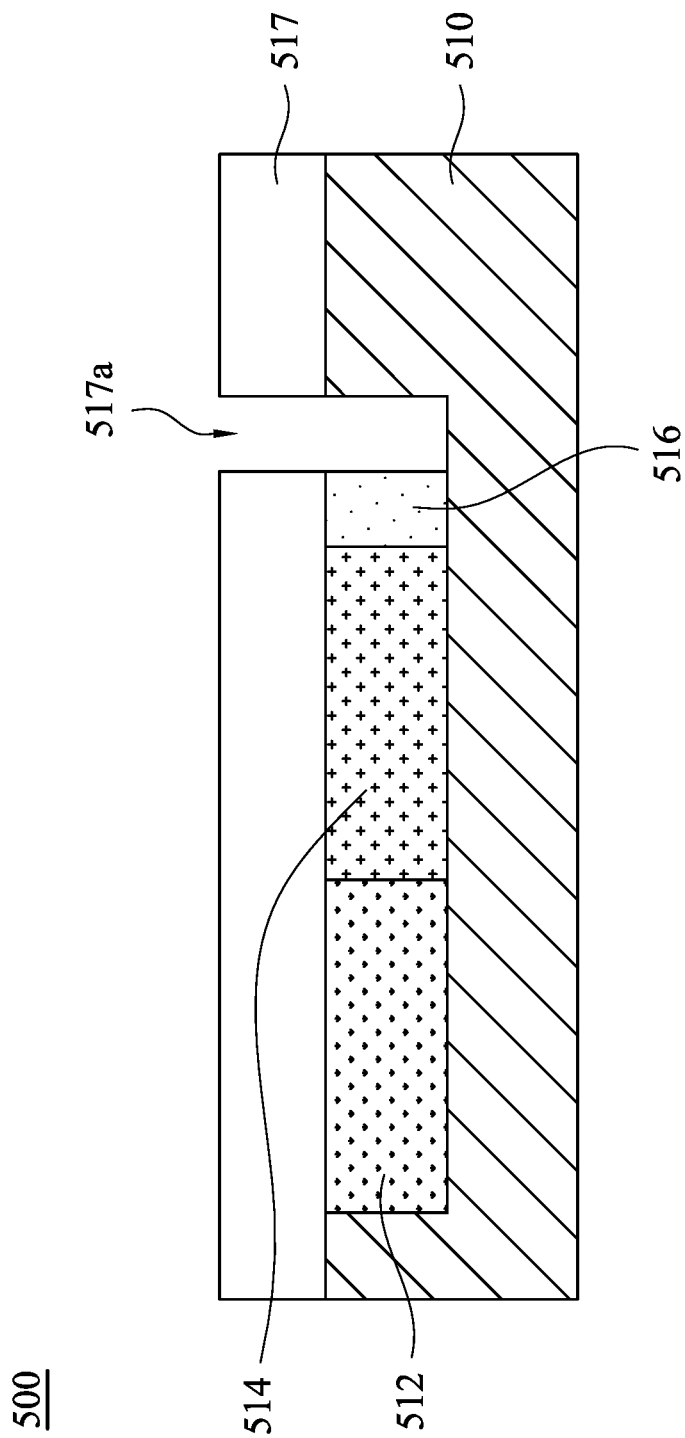

Reference is made to FIG. 37. After the mask layer 515 is removed, a mask layer 517 is deposited on the FinTFET 500 over the source region 512, channel region 514 and tunnel barrier layer 516. An opening 517a is formed in the mask layer 517. The opening 517a exposes a portion of the semiconductor substrate 510 which is adjacent to the tunnel barrier layer 516. An etching process is performed to remove the exposed portion of the semiconductor substrate 510, and a recess is formed.

Figure 38:
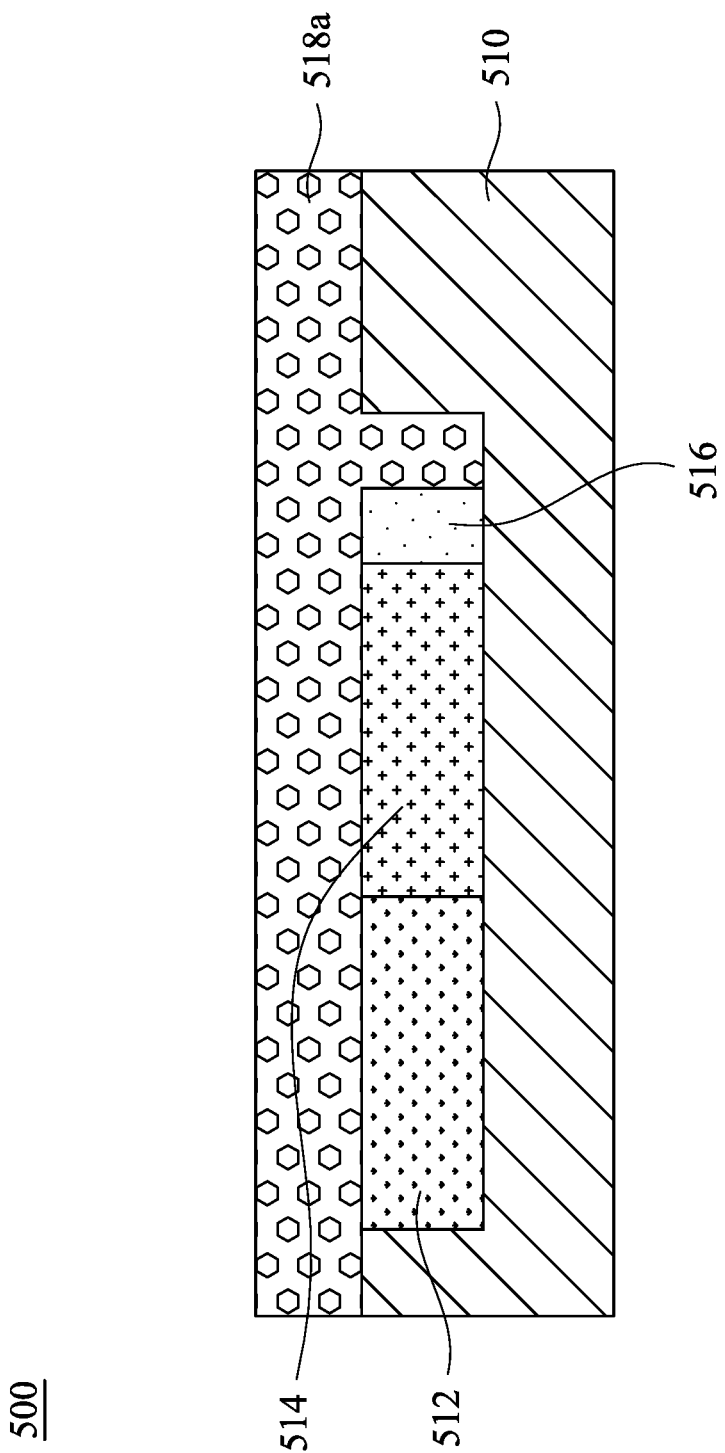

Reference is made to FIG. 38. The mask layer 517 is removed, and a semiconductor shell material 518a is deposited on the FinTFET 500 to replace the space left by the mask layer 517. The semiconductor shell material 518a fills in the recess in the semiconductor substrate 510 and overfills on the top surface of the source region 512, channel region 514, and tunnel barrier layer 516. The semiconductor shell material 518a is attached to the top surface and one side of the tunnel barrier layer 516. The semiconductor shell material 518a includes the same semiconductor material as the channel region 514, while the semiconductor shell material 518a is intrinsic.

Figure 39:
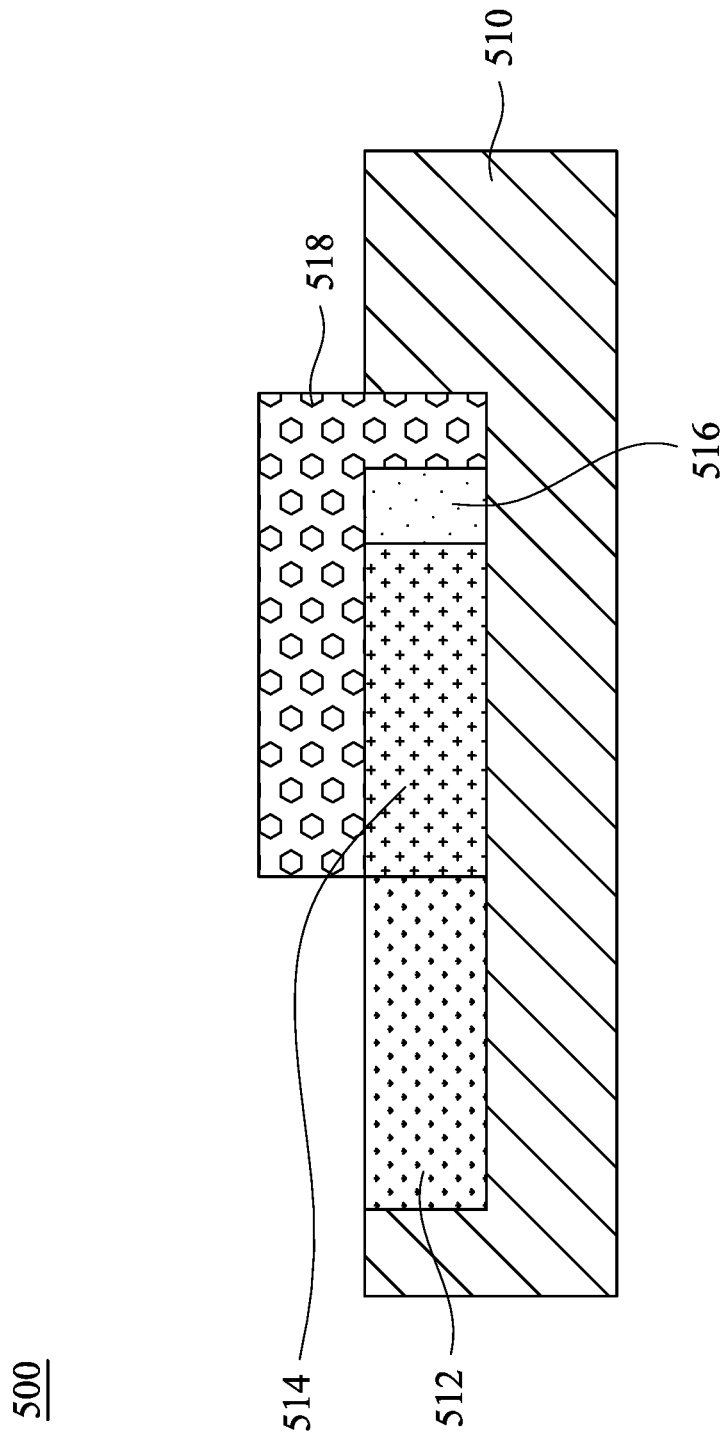

Reference is made to FIG. 39. The semiconductor shell material 518a is patterned, and a portion of the semiconductor shell material 518a is removed to form a one-side semiconductor shell 518. The semiconductor shell 518 forms an L shape block over the channel region 514 and the tunnel barrier layer 516. One leg of the semiconductor shell 518 rests on the top surface of the channel region 514 and tunnel barrier layer 516. The other leg of the semiconductor shell 518 stands on the semiconductor substrate 510 and covers the other side of the tunnel barrier layer 516. The turning corner of the semiconductor shell 518 rests on the corner of the tunnel barrier layer 516.

Figure 40:
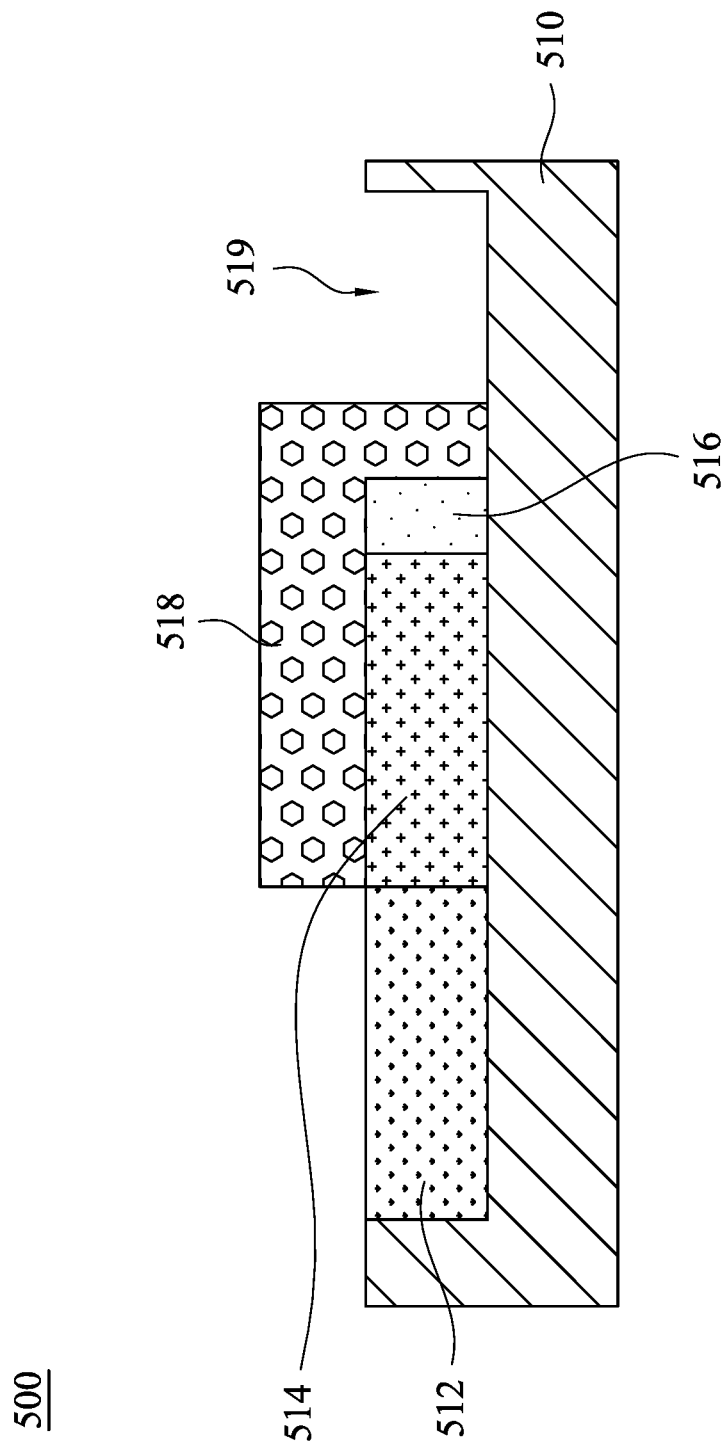

Reference is made to FIG. 40. A semiconductor substrate 510 is etched to form a recess 519. The recess 519 is positioned next to the semiconductor shell 518 and in line with the channel region 514 and source region 512. The recess 519 is where the drain region will be epitaxially formed in the subsequent process. The tunnel barrier layer 516 and the channel region 514 are half enclosed by the semiconductor shell 518 and half buried in the semiconductor substrate 510.

Figure 41:
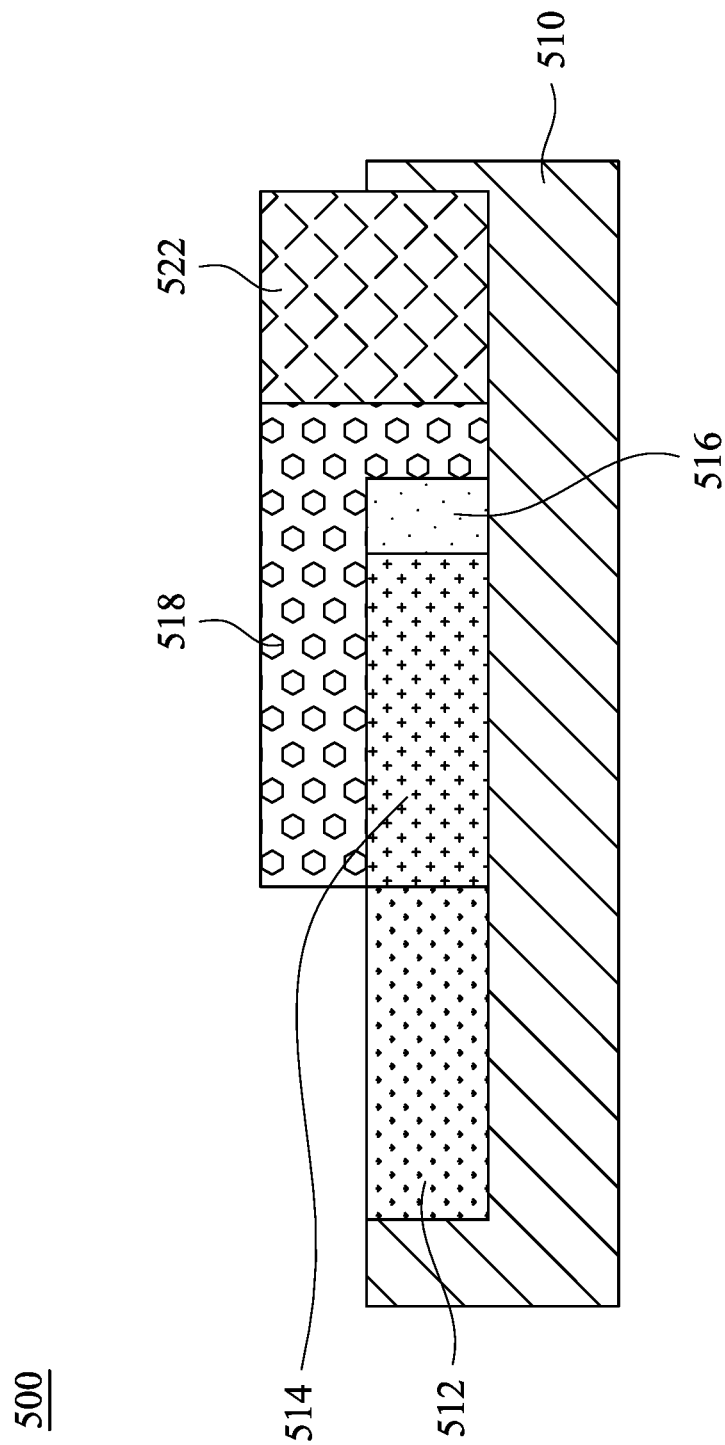

Reference is made to FIG. 41 and operation 110 in FIG. 1. A drain region 522 is formed in the recess 519 of the semiconductor substrate 510 using an epitaxy process, such as MOCVD, MBE, LPE, VPE, SEG, combinations thereof, and the like. The drain region 522 includes a second type semiconductor. Examples of the second type semiconductor may include group IV materials such as Si, Ge, C and binary compounds thereof, or Group III-V materials such as In, Ga, As, Sb, Al, P, B, N and binary, tertiary and quaternary compounds. For example, the drain region 522 may include InAs. The drain region 522 has a second type dopant. In some embodiments, in which the FinTFET 500 is an n-type transistor, the second type dopant is an n-type dopant. In some embodiments, in which the FinTFET 500 is a p-type transistor, the second type dopant in the drain region 522 is a p-type dopant. The drain region 522 may be moderately doped or a heavily doped, and a drain region dopant concentration ranges between about $1E17/cm^3$ and about $1E21/cm^3$.

Reference is still made to FIG. 41. The drain region 522 may adapt the thickness of one leg of the semiconductor shell 518 as shown in FIG. 27. The drain region 522 overgrows the top surface of the semiconductor substrate 510 and is level with a top surface of the semiconductor shell 518. One leg of the semiconductor shell 518 is between the tunnel barrier layer 516 and the drain region 522. The semiconductor shell 518 becomes the contact interface with the drain region 522.

Figure 42:
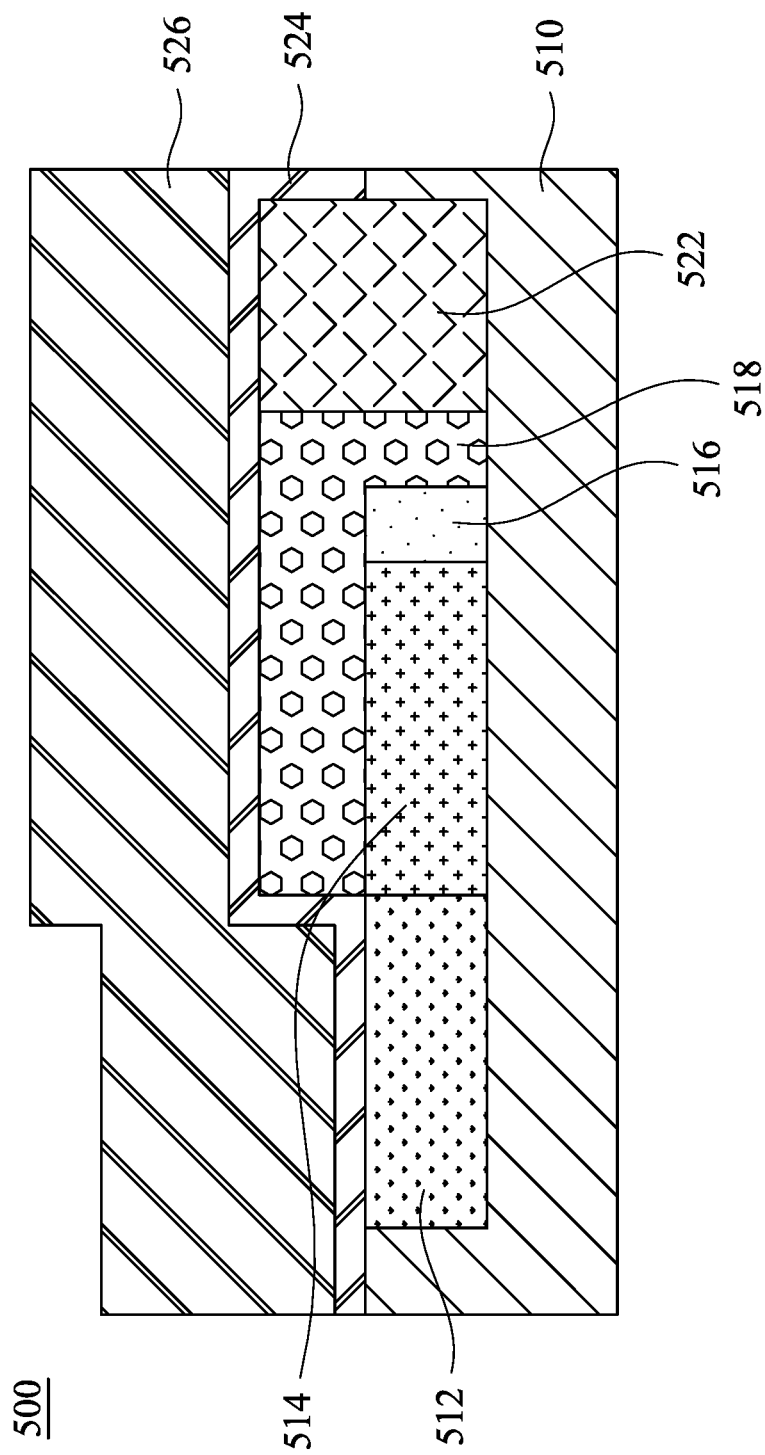

Reference is made to FIG. 42 and operation 150 of FIG. 1. A gate dielectric layer 524 and a gate electrode 526 are conformally formed on the FinTFET 500. The gate dielectric layer 524 and the gate electrode 526 may be deposited by for example, CVD, PVD, ALD, spreading, spin coating, or the like. The gate dielectric layer 524 blankets the underlying source region 512, semiconductor shell 518 and drain region 522. In some embodiments, the gate dielectric layer 412 is high-k dielectric layer (k is larger than 6).

Figure 43:
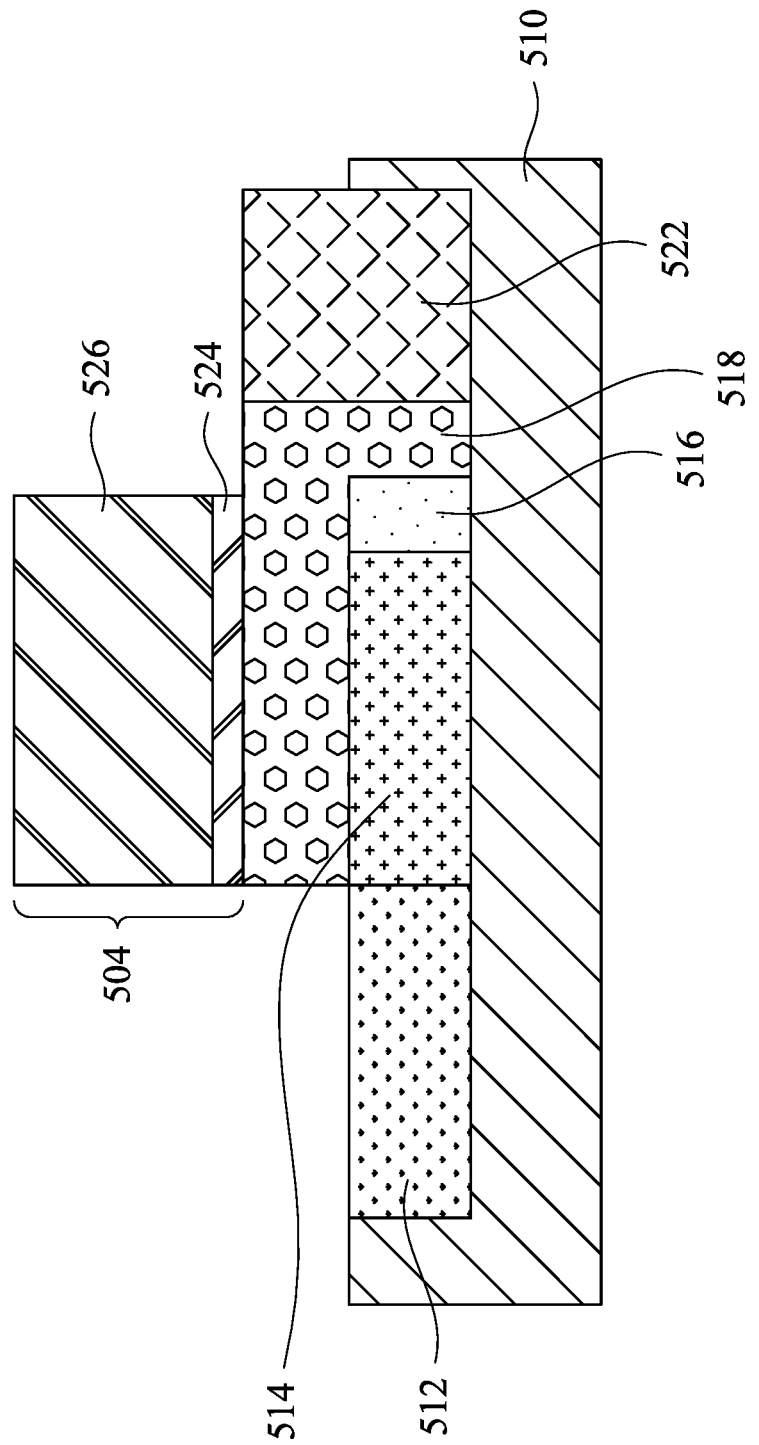

Reference is made to FIG. 43 and operation 150 of FIG. 1. The gate dielectric layer 524 and the gate electrode 526 are patterned to form the gate stack 504 on the semiconductor shell 518. The gate stack 504 is positioned over the channel region 514 and the tunnel barrier layer 516. The gate dielectric layer 524 is in contact with the semiconductor shell 518, while a portion of the semiconductor shell 518 is not underlying the gate stack 504. A portion of the top surface of the semiconductor shell 518 is free from the coverage of the gate stack 504. The portion is level with the drain region 522. The interface where the semiconductor shell 518 and the drain region 522 meet is not under the coverage of the gate stack 504.

Figure 44:
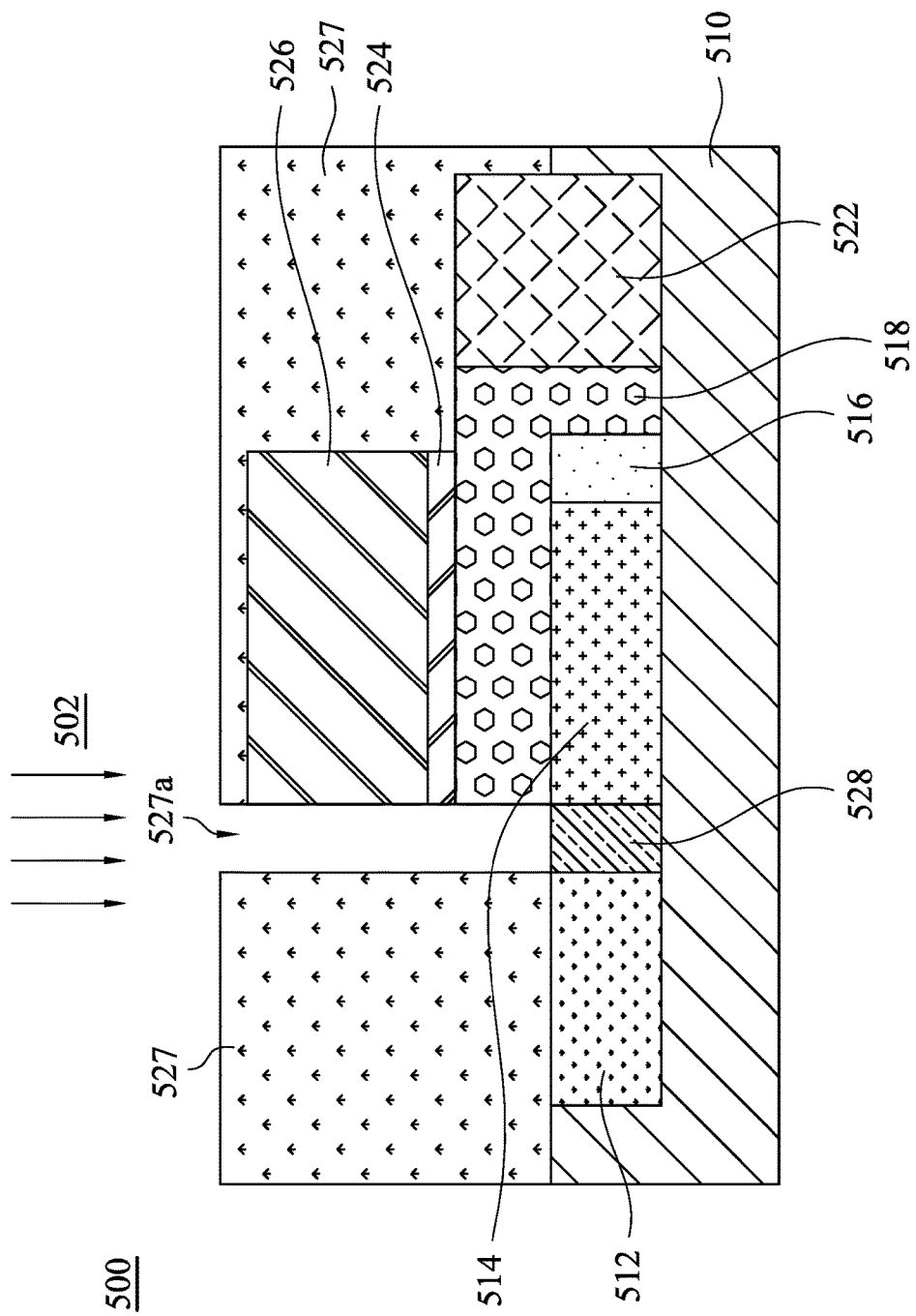

Reference is made to FIG. 44 and operation 130 of FIG. 1. An epitaxial process 502 is performed to form a pocket 528 in the source region 512 and at the source-channel junction. A mask layer 527 is deposited on the semiconductor substrate 510, and an opening 527a is formed at the source-channel junction. Next, the exposed source region 512 is removed. Subsequently, the epitaxial growth of the pocket 528 is conducted. The source region 512 has the first type dopant, and the pocket 528 is more intensely doped with the first type dopant to a degree of heavily doped or beyond dopant saturation. The pocket 528 occupies a portion of the existing source region 512 close to an interface between the source region 512 and the channel region 514. The epitaxial process 502 results in the pocket 528 being saturated with the first type dopant. The first type dopant concentration of the pocket 528 is higher than the dopant concentration in the source region 512 of about a factor between about 2 and 5. A leap in the dopant concentration is shown between the remaining source region 512 and the pocket 528. For example, in some embodiments, the source region 512 has a first type dopant concentration of about 1E18/cm3, and the pocket 528 has a first type dopant concentration of about 1E20/cm3. In some embodiments, the source region 512 has a first type dopant concentration of about 1E18/cm3, and the pocket 528 has a first type dopant concentration of about 1E21/cm3.

Figure 45:
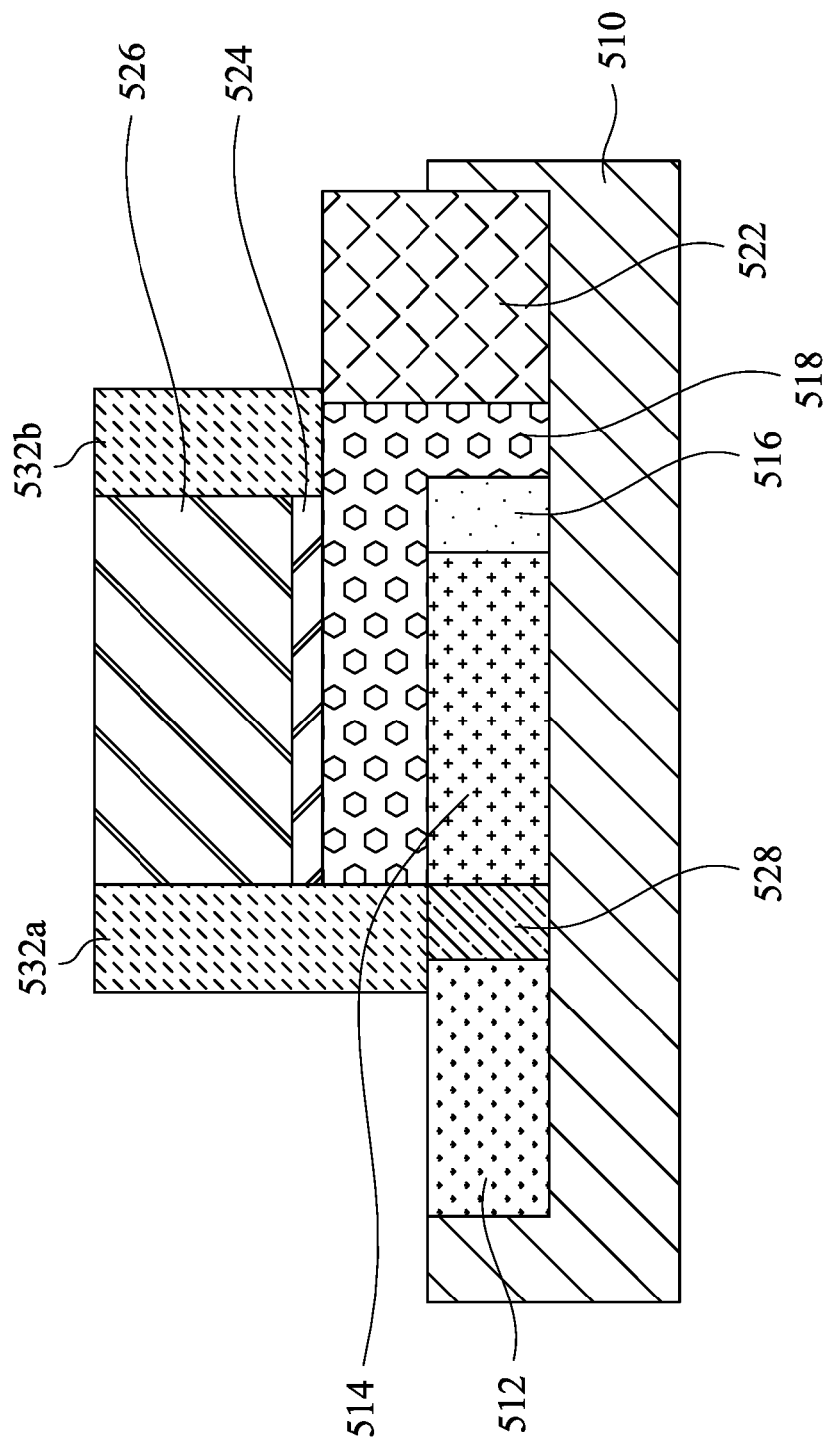

Reference is made to FIG. 45 and operation 140 in FIG. 1. Low-k spacers 532a and 532b are formed around sidewalls of the gate stack 504. In some embodiments, a low-k spacer material is blanket deposited on the FinTFET 500. The low-k spacer material is then patterned to remove excess portion on the semiconductor substrate 510. The low-k spacers 532a and 532b may not be in the same thickness. As shown in FIG. 31, the low-k spacer 532a at the source region 512 has a larger thickness because it stands on the level same as the semiconductor substrate 510. The thickness of the low-k spacer 532a is measured of the combined thickness of the semiconductor shell 518 and the gate stack 504. The low-k spacer 532b at the drain region 522 is shorter because it stands on the semiconductor shell 518. The thickness of the low-k spacer 532b is measured of the thickness of the gate stack 504. In some embodiments, one of the low-k spacer 532a stands on a portion of the source region 512 and the entire top surface of the pocket 528. The other low-k spacer 532b stands on the semiconductor shell 518 and a portion of the drain region 522. In some embodiments, the low-k spacer 532a may stand on the top surface of the pocket 528, and the source region 512 is not under the coverage of the low-k spacer 532a. In some embodiments, the low-k spacer 532b at the drain region 522 may be omitted, such that the low-k spacer 532a does not have a counterpart.

The electrons travel from the source region 512 and pass through the heavily doped pocket 528. The heavily doped (or doped beyond dopant saturation) pocket 528 reduces the source depletion. The low-k spacer 532a minimizes the impact of the gate electric field on the source side at the source-channel junction. The electrons travel further to the channel region 514, and the tunnel barrier layer 516 blocks the passage. The electrons are then diverted to the intrinsic semiconductor shell 518, which can be seen as an extension of the channel. The electrons go through the semiconductor shell 518, and through the passage provided by the semiconductor shell 518 finally reach the drain region 522.

In some embodiments, a semiconductor device includes a channel region, a source region having a first type semiconductor and a drain region having a second type semiconductor on opposing sides of the channel region. A gate stack is disposed over the channel region. A low-k spacer is disposed over the source region and abreast the gate stack.

In some embodiments, a semiconductor device includes a channel region, a source region having a first type semiconductor and a first type dopant. A drain region has a second type semiconductor and a second type dopant. The source region and drain region are on opposing sides of the channel region. A gate stack is disposed over the channel region. A pocket is disposed between the channel region and the source region. The pocket has the first type semiconductor and the first type dopant. The pocket has a higher first type dopant concentration than a first type dopant concentration of the source region.

In some embodiments, a method of fabricating a semiconductor device includes forming an active region. The active region includes a channel region, a source region and a drain region. The source region and drain region are on opposing sides of the channel region. The source region has a first type dopant. A gate stack is disposed over the channel region. A pocket is formed between the source region and the channel region. The pocket has the first type dopant to a degree beyond dopant saturation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a channel region;
   a source region having a first type dopant and a drain region having a second type dopant on opposing sides of the channel region;

a gate stack disposed over the channel region;
a pocket between the channel region and the source region, the pocket having the first type dopant, wherein a first type dopant concentration of the pocket is higher than a first type dopant concentration of the source region; and
a low-k spacer disposed over the source region, wherein a bottom surface of the low-k spacer is in contact with the pocket and the source region.

2. The semiconductor device of claim 1, wherein the channel region is intrinsic.

3. The semiconductor device of claim 1, further comprising a semiconductor column, wherein a first portion of the semiconductor column is the source region, a second portion of the semiconductor column is the channel region, and a third portion of the semiconductor column is the drain region.

4. The semiconductor device of claim 1, wherein the gate stack surrounds the channel region.

5. The semiconductor device of claim 1, wherein the low-k spacer surrounds a portion of the source region.

6. The semiconductor device of claim 1, wherein the channel region has the first type dopant.

7. The semiconductor device of claim 1, further comprising:
an intrinsic semiconductor shell interposed between the gate stack and the channel region.

8. The semiconductor device of claim 1, further comprising:
a barrier layer between the channel region and the drain region.

9. The semiconductor device of claim 8, wherein the barrier layer comprises a material having a larger band gap than a material of the channel region.

10. The semiconductor device of claim 1, further comprising:
a semiconductor shell interposed between the channel region and the drain region; and
a barrier layer between the channel region and the semiconductor shell, wherein the barrier layer comprises a material having a larger band gap than a material of the channel region.

11. A semiconductor device comprising:
a channel region;
a source region having a first type dopant;
a drain region having a second type dopant, the source region and drain region being on opposing sides of the channel region;
a gate stack around the channel region;
a pocket disposed between the channel region and the source region, the pocket having the first type dopant, wherein the pocket has a higher first type dopant concentration than a first type dopant concentration of the source region; and
a low-k spacer having a sidewall in contact with the pocket and the source region.

12. The semiconductor device of claim 11, wherein the channel region is intrinsic.

13. The semiconductor device of claim 11, further comprising a semiconductor column, wherein a first portion of the semiconductor column is the source region, a second portion of the semiconductor column is the pocket, a third portion of the semiconductor column is the channel region, and a fourth portion of the semiconductor column is the drain region.

14. The semiconductor device of claim 11, wherein a width of the drain region is wider than a width of the source region.

15. A semiconductor device comprising:
a channel region;
a source region and a drain region being on opposing sides of the channel region, wherein the source region and the channel region have a first doped type, the drain region has a second doped type, and a width of the drain region is wider than a width of the channel region and a width of the source region;
an intrinsic semiconductor shell disposed surrounding the channel region and interposed between the channel region and the drain region; and
a gate stack disposed around the channel region, wherein the intrinsic semiconductor shell is interposed between the gate stack and the channel region.

16. The semiconductor device of claim 15, further comprising:
a pocket disposed between the channel region and the source region, wherein the pocket has the first doped type and has a higher first type dopant concentration than a first type dopant concentration of the source region.

17. The semiconductor device of claim 15, further comprising:
a barrier layer between the channel region and the intrinsic semiconductor shell, wherein the barrier layer comprises a material having a larger band gap than a material of the channel region.

18. The semiconductor device of claim 17, wherein a portion of the intrinsic semiconductor shell is interposed between the barrier layer and the drain region.

19. The semiconductor device of claim 15, further comprising a low-k spacer disposed over the source region, wherein an edge of the intrinsic semiconductor shell is in contact with the low-k spacer.

20. The semiconductor device of claim 15, wherein a sidewall of the drain region is substantially aligned with a sidewall of the intrinsic semiconductor shell.

* * * * *